(12) United States Patent
Komiyama et al.

(10) Patent No.: US 6,627,914 B1
(45) Date of Patent: Sep. 30, 2003

(54) MILLIMETER WAVE AND FAR-INFRARED DETECTOR

(75) Inventors: Susumu Komiyama, Tokyo (JP); Astafiev Oleg, Tokyo (JP); Antonov Vladimir, Kanagawa (JP); Hiroshi Hirai, Tokyo (JP); Takeshi Kutsuwa, Tokyo (JP)

(73) Assignee: Japan Science and Technology Corporation, Kawaguchi (JP)

( * ) Notice: Subject to any disclaimer, the term of this patent is extended or adjusted under 35 U.S.C. 154(b) by 118 days.

(21) Appl. No.: 09/763,603

(22) PCT Filed: Jul. 7, 2000

(86) PCT No.: PCT/JP00/04540
§ 371 (c)(1),
(2), (4) Date: Feb. 26, 2001

(87) PCT Pub. No.: WO01/06572
PCT Pub. Date: Jan. 25, 2001

(30) Foreign Application Priority Data

| | | |
|---|---|---|
| Nov. 25, 1999 | (JP) | 11-334196 |
| Aug. 11, 1999 | (JP) | 11-228037 |
| Jul. 15, 1999 | (JP) | 11-202261 |

(51) Int. Cl.⁷ .......................................... H01L 29/06
(52) U.S. Cl. ............... 257/29; 257/14; 257/21; 257/24; 257/187; 257/192; 257/194; 257/195; 257/452; 257/457; 257/465
(58) Field of Search ............... 257/14, 20, 21, 257/24, 187, 192, 194, 452, 457, 459, 465, 195

(56) References Cited

U.S. PATENT DOCUMENTS

| | | | | |
|---|---|---|---|---|
| 5,440,148 A | * | 8/1995 | Nomoto | 257/21 |
| 5,679,961 A | * | 10/1997 | Higurashi et al. | 257/14 |
| 5,989,947 A | * | 11/1999 | Dilger et al. | 438/172 |
| 6,069,380 A | * | 5/2000 | Chou et al. | 257/315 |
| 6,455,872 B1 | * | 9/2002 | Williams et al. | 257/14 |
| 2002/0179897 A1 | * | 12/2002 | Eriksson et al. | 257/14 |
| 2002/0197831 A1 | * | 12/2002 | Todd et al. | 438/528 |

FOREIGN PATENT DOCUMENTS

| | | | |
|---|---|---|---|
| EP | 345 972 | * | 5/1989 |
| EP | 2 306 769 | * | 5/1997 |
| EP | 1 077 492 | * | 2/2001 |
| GB | 2 306 769 | * | 5/1997 |
| JP | 8-51232 | | 2/1996 |
| JP | 11-4017 | | 1/1999 |

OTHER PUBLICATIONS

Astafiev et al. "Electrostatics of quantum dots in high magnetic field and single far–infrared photon detection" Phys. Review B, vol. 62, No. 24, Dec. 2000.*

(List continued on next page.)

Primary Examiner—Nathan J. Flynn
Assistant Examiner—Ahmed N. Sefer
(74) Attorney, Agent, or Firm—Armstrong, Westerman & Hattori, LLP

(57) ABSTRACT

An MR/FIR light detector is disclosed herein that has extraordinarily high degree of sensitivity and a high speed of response. The detector includes an MR/FIR light introducing section (1) for guiding an incident MR/FIR light (2), a semiconductor substrate (14) formed with a single-electron transistor (14) for controlling electric current passing through a semiconductor quantum dot (12) formed therein, and a BOTAI antenna (6, 6a, 6b, 6c) for concentrating the MW/FIR light (2) into a small special zone of sub-micron size occupied by the semiconductor quantum dot (12) in the single-electron transistor (14). The quantum dot (12) forming a two-dimensional electron system absorbs the electromagnetic wave concentrated efficiently, and retains an excitation state created therein for 10 nanoseconds or more, thus permitting electrons of as many as one millions in number or more to be transferred with respect to a single photon absorbed.

32 Claims, 12 Drawing Sheets

OTHER PUBLICATIONS

Shcoelkopf et al. "A concept for a Submillimeter–Wave Single–Photo Counter" IEEE Transactions on Applied Superconductivity, vol. 9, Jun. 1999.*

IEEE Transactions on Applied superconductivity, vol. 9, No. 2, Jun. 1999, pp. 2935–2939, R. J. Schoelkopf et al., "A Concept for a Supermillimeter–Wave Single Photon Counter".

App0lied Physics Letters, vol. 61, No. 23, Dec. 7, 1992, pp. 2820–2822, A. N. Cleland et al, "Very Low Noise Photodetector Based on the Single Electron Transistor".

* cited by examiner

A-type

B-type

MILLIMETER WAVE AND FAR-INFRARED DETECTOR

TECHNICAL FIELD

This invention relates to MW(Millimeter Wave)/FIR(Far Infra Red) light detectors for detecting video signals in the MW and FIR wavelength range using a MW/FIR measuring instrument, especially by controlling semiconductor quantum dots.

BACKGROUND ART

In general, detectors for electromagnetic waves include a frequency mixer that applies phase sensing wave detection and a video signal detector that adopts incoherent wave detection, of which the latter is known to provide higher sensitivity in detecting a feeble or weak light.

Of the conventional video signal detectors for such lights in an MW/FIR wavelength range, those that offer best sensitivities are a germanium composite bolometer for use at a cryogenic temperature of 0.3 K or lower for a light of a wavelength in the range of 0.1 to 1 mm, and a germanium doped photoconductive detector for use at a low temperature around 2 K for a light of a wavelength in the range of 0.06 to 0.1 mm.

These detectors provide noise equivalent powers (NEP) that reach as high as $10^{-16}$ to $10^{-18}$ WHZ$^{-\frac{1}{2}}$.

This as seen in terms of energy quanta of electromagnetic waves or photons means that the sensitivity of such a detector is such that in one second of measurement, the detector cannot detect a signal as more than a noise unless photon packets of about one million or more in number are incident on the detector.

In addition, such a detector has a speed of response as very low as 100 millisecond. While slow response detectors such as a superconducting bolometer, superconducting tunnel junction and hot electrons in a semiconductor (InSb) have been utilized, their sensitivities fall below that of a germanium composite bolometer.

Apart from the detectors mentioned above, it has been known that irradiating a single-electron transistor with a microwave gives rise to a signal by photon assisted tunneling effect. However, a detector that utilizes this effect is low in sensitivity because between the electrodes no more than one electron moves by absorption of one electromagnetic-wave photon.

Thus, there has so far been no detector that is excellent in both sensitivity and speed of response. This is for the reasons that in any of the detectors, conduction electrons because of lying in a continuous energy band structure are short in the life in which they remain excited by an electromagnetic wave; that since a detector detects an electromagnetic wave in terms of a change in electrical conductance by all the electrons in the detector, an effect brought about by the excitation of a small number of electrons is weakened by the other electrons overwhelming in number; and further that as in the photon assisted tunneling, between the electrodes no more than one electron moves by absorbing one electromagnetic-wave photon.

It is accordingly an object of the present invention to circumvent resolving the problems encountered by the conventional detectors and to provide MW/FIR light detectors predicated on principles or mechanisms totally different from those mentioned above, which detectors have an extraordinary degree of sensitivity and are quick in response.

DISCLOSURE OF THE INVENTION

In order to achieve the object, mentioned above, there is provided in accordance with the present invention in one form of embodiment thereof an MW(millimeter wave)/FIR (infra red) light detector that comprises an electromagnetic-wave coupling means for concentrating an electromagnetic wave in a small special region of a submicron size a quantum dot for absorbing the concentrated electromagnetic wave to bring about an excited state between electron levels, and a single-electron semiconductor.

In addition to the make-up mentioned above an MW/FIR detector according to the present invention preferably retains a state in which an electrical conductance of the said single-electron semiconductor is varied according to the said excited state of the quantum dot.

In an MW/FIR detector as mentioned above, the said quantum dot preferably has a life in a range of 10 nanoseconds to 1000 seconds in which it remains in the said excited state before returning to a ground state thereof.

According to one specific feature of the present invention, the said electron levels have a difference in energy that is controllable variably according to any one or a combination of a change in size of the said quantum dot, an external magnetic field and a biasing voltage.

According to another specific feature of the present invention, the said excited state is established by any one or a combination of a resonance excitation of electrons according to a size effect of the said quantum dot, a resonance excitation of electrons between Landau levels by application of a magnetic field and an excitation between spin states separated by a magnetic field.

For the said electromagnetic-wave coupling means use may be made of a standard or regular BOTAI antenna for electrically coupling the said quantum dot and the said electromagnetic wave together.

For the said electromagnetic-wave coupling means, use may also be made of an anomalous or irregular BOTAI antenna having an node thereof short-circuited for magnetically coupling the said quantum dot and the said electromagnetic wave together.

Preferably, the presence or absence of short circuit through a node of the said electromagnetic-wave coupling means and the size of the said quantum dot are determined according to the wavelength of the said electromagnetic wave.

The said electromagnetic-wave coupling means may be used also to provide a gate electrode for the said single-electron transistor.

The present invention provides in a second form of embodiment, thereof an MW/FIR light detector, characterized in that the detector comprises: an electromagnetic-wave coupling means for concentrating an electromagnetic wave in a small special region of a sub-micron size; a first quantum dot for absorbing the electromagnetic wave concentrated by the said electromagnetic-wave coupling means to bring about an ionization thereof; and a single-electron transistor including a second quantum dot electrostatically coupled to the said first quantum dot, whereby the said electromagnetic wave is detected on the basis of the fact that electric conductivity of the said single-electron transistor varies with a change in electrostatic state of the said second quantum dot consequent upon an ionization of the said first quantum dot.

The above mentioned ionization of the said first quantum dot may be brought about by excitation of an electron in a quantized bound state of the said first quantum dot to a free electron state of an electron system outside of the said first quantum dot.

The ionization energy of the said first quantum dot may be controllable variably by changing the magnitude of a bias voltage applied to a gate of the said first quantum dot.

The said first quantum dot may have a life in a range between 1 microsecond and 1000 seconds in which it remains in the ionization state before returning to a neutral state.

The said first and second quantum dots preferably lie in an identical semiconductor structure and are isolated from each other electrostatically by bias voltages applied to respective gates thereof, respectively.

The said first and second quantum dots may be formed adjacent to each other across a gap in a semiconductor.

Preferably, the said second quantum dot comprises a metal dot formed on the said first quantum dot and forms the said single-electron transistor by having a tunnel junction with a metal lead wire formed on the said metal dot.

Then, the said second quantum dot preferably an aluminum metal dot and has a portion of a said tunnel junction formed from aluminum oxide.

The said electromagnetic-wave coupling means may be a standard dipole antenna for electrically coupling the said first quantum dot and the said electromagnetic wave together.

The said electromagnetic-wave coupling means may be used also to serve as a bias voltage applying gate that forms the said first and second quantum dots.

The said electromagnetic-wave coupling means preferably has a lead portion oriented longitudinally in a direction that is perpendicular to a direction of the axis of polarization of the said electromagnetic-wave coupling means.

The node of the said electromagnetic-wave coupling means preferably is substantially equal in size to a maximum size of a said quantum dot.

The said electromagnetic-wave coupling means may have an electrode diameter that is about one half less in length than the wavelength of the said electromagnetic wave.

The said single-electron transistor may have a single hetero structure that forms a two-dimensional electron system and a said quantum dot may be formed by electrically confining a two-dimensional electron gas by a gate electrode of the said single-electron transistor.

The said single-electron transistor preferably comprises a single hetero structure that forms a two-dimensional electron system a gate electrode for controlling electrostatic potential of a said quantum dot tunnel coupled via to the said two-dimensional electron system, and a source and a drain electrode that form a source and a drain region, respectively, which are tunnel coupled to the said quantum dot.

The said single-electron transistor preferably includes a gate electrode for controlling source-drain electric current and a gate electrode for forming a said quantum dot.

The source electrode and the drain electrode of the said single-electron transistor preferably are apart from each other by a distance that is not less than the length of the said electromagnetic-wave coupling means in a direction of its axis of polarization.

The said single-electron transistor comprises a compound semiconductor, especially a III–V group compound semiconductor.

For the said single-electron transistor, preference is also given of a III–V group compound semiconductor superlattice selection doped, single hetero structure.

The said single-electron transistor preferably has a aluminum-gallium arsenide/gallium arsenide selection doped, single hetero structure.

The said single-electron transistor preferably comprises a IV group semiconductor.

The said single-electron transistor preferably is formed symmetrically about a said quantum dot.

An MW/FIR light detector according to the second form embodiment of the present invention preferably further includes a light introducing means for guiding the said electromagnetic wave into the said electromagnetic-wave coupling means.

According to an MW/FIR light detector of the present invention constructed as mentioned above, an electromagnetic wave to be detected is efficiently concentrated in a quantum dot by an electromagnetic-wave coupling means, and a resonance excitation brought about between electron levels in the quantum dot by absorbing the electromagnetic wave is detected upon amplification by a single-electron transistor.

If the detecting means is a standard or regular BOTAI (i.e., "bow tie") antenna, an excitation is brought about electrically by transition in the quantum dot. If it is an anomalous or irregular BOTAI antenna, an excitation is magnetically brought about in the quantum dot.

Also, if the quantum dot of the single-electron transistor is with an aluminum-gallium arsenide/gallium arsenide selection doped, single hetero structure crystal, it is a small dot having an effective diameter in a two-dimensional electron system ranging from 0.02 $\mu$m to 0.6 $\mu$m.

Serving the electromagnetic-wave coupling means as a gate electrode of the single-electrode transistor couples the quantum dot weakly to a two-dimensional electron system in its outside via a tunnel junction.

In this way, the present invention enables the energy of an electromagnetic wave to be converged and absorbed in a quantum dot of a size that, is one hundredth or less smaller than the wavelength of the electromagnetic wave and then the excited state brought about to be retained for 1.0 nanoseconds or more.

As a consequence, a change in electrical conductivity caused by absorption of one electromagnetic photon is kept for 10 nanoseconds or more. Although the time constant of a single-electron transistor when operated is in actuality circumscribed by an amplifier used, constructing a current amplifier circuit by combining a HEMT amplifier cooled to a helium (liquefier, refrigerator or cooling) temperature and an LC tank circuit permits such a change in conductivity to be measured in a time constant of three (3) nanoseconds. Therefore, detecting a single photon can be actualized under a practical condition.

Also, in case a pair of separate quantum dots, i.e., a first quantum dot for absorbing an electromagnetic wave and a second quantum dot which is conductive, for detection are used, a positive bole and an electron that are excited upon absorbing an electromagnetic energy are created separately in the inside and outside of the first quantum dot. This enables an extremely prolonged state of excitation, hence life of ionization to be established without the need to apply a magnetic field. Therefore, a rise in sensitivity is achieved without the need to use a magnetic field while permitting a single photon to be readily detected.

Further, in an electron system that constitutes the first quantum dot there exists a threshold value for utilizing excitation from a discrete level to a continuous band level, to wit, a continuous wavelength range that possesses an amount of energy in excess of the ionization energy and thus offers good detection sensitivity. The threshold wavelength, to wit, the ionization energy can also be controlled directly through the adjustment of the height of the potential barrier by the gate voltage.

It has further been found that reducing the second quantum dot in size permits the operating temperature to be raised up to a maximum of 2 K.

An MW/FIR light detector according to the present invention makes uses of a single-electron transistor (hereinafter referred to also as "SET") by a semiconductor quantum dot. A SET possesses a single hetero structure of a semiconductor superlattice that forms a two-dimensional electron gas, for example. It is formed of a dot that is a very small isolated conductive region weakly coupled through a tunnel junction to a source and a drain region by a source and a drain electrode, and is provided with a control gate electrode for controlling the electrostatic potential of the dot.

It should be noted further that the SET may comprise a compound semiconductor, especially a compound semiconductor of a III–V group compound, and may have a selection doped, single hetero structure with a III–V group compound semiconductor superlattice. Further, in the case of a plurality of quantum dots used in forming an MW/FIR light detector of the present invention, the SET may be a semiconductor of a compound of the IV group.

If the bias voltage of the control gate electrode is varied, the electrochemical potential of a conduction electron in the dot will vary. Then, a source-drain current $I_{SD}$ will flow only under the condition that the same is equal to the Fermi energy of the source and drain electrodes.

The conductivity of a SET in its such conductive state $G=I_{SD}/V_{SD}$ in general becomes $[100–400 \text{ K}\Omega]^{-1}$. Here, $V_{SD}$ represents a source-drain voltage of the SET, which must be set at not more than 100 $\mu$V in the present invention.

If for the conductive dot, use is made of a semiconductor quantum dot whose effective size is 0.02 to 0.6 $\mu$m in diameter, the energy level of its internal electron system will be quantized by its size effect and according to a magnetic field applied externally. And its energy level spacing then corresponds to a light quantum in a MW/FIR light region. That energy level spacing can be controlled by changing the size of the quantum dot, or externally applying a magnetic field or a bias voltage. Accordingly, it becomes possible to excite electrons resonantly inside the quantum dot by irradiating it with an MW/FIR light. However, as described later, the state excited varies depending on the way of excitation and the presence or absence of a magnetic field applied.

In either the case, since the wave function of the excited electrons in their special symmetry and distribution varies from the wave function of electrons in their ground state, the electrochemical potential of the quantum dot and the intensity of its tunnel coupling to source and drain regions vary to a large extent. For this reason, the excitation of one electron alone in the semiconductor quantum dot causes the conductivity of the SET to, vary as largely as 20 to 99% and permits the state that the conductivity is varied to be retained until the excited state diminishes and returns to the ground state, to wit, for the life of the states of excitation and its relaxation.

On the other hand, the excited quantum dot because of its structure of discrete energy levels has its life as long as 10 nanoseconds to 1000 seconds before returning to its ground state and hence becomes a detector that is extremely high in sensitivity. The changes in number of the electrons fed from the source electrode into the drain electrode, $N=GV_{SD}T(X/100)/e$, where a change X% in the conductivity lasts for T seconds, are as numerous as $10^6$ under a typical condition that $G=1/300$ k$\Omega$, X=50%, T=1 mseconds and $V_{SD}=0.05$ mV. Thus, absorbing one photon can transport electrons as many as one millions in number or more.

Moreover, the time constant $C_{SD}/G$ of operation of a SET in principle is as extremely short as several tens picoseconds, where $C_{SD}$ is an electrostatic capacitance between source and drain electrodes. It thus becomes possible to detect a single MW/FIR photon by way of quick time splitting measurement of an electric current.

BRIEF DESCRIPTION OF THE DRAWINGS

The present invention will better be understood from the following detailed description and the drawings attached hereto showing certain illustrative forms of embodiment of the present invention. In this connection, it should be noted that such forms of embodiment illustrated in the accompanying drawings hereof are intended in no way to limit the present invention but to facilitate an explanation and understanding thereof.

In the drawings:

FIGS. 2A and 2B illustrate an MW/FIR light detector according to the present invention wherein FIG. 2A is a plan view of a single-electron transistor made of a BOTAI antenna and FIG. 2B is a partial diagrammatic view of a mesa structure;

FIGS. 3A, 3B and 3C diagrammatically illustrate each a planar structure of a BOTAI antenna in a region of its node wherein FIG. 3A shows one for use in a detector operable with no magnetic field applied and for an MW/FIR light having a wavelength of 0.5 to 10 mm, FIG. 3B shows one for use in a detector operable under a magnetic field of 1 to 7 T and for an MW/FIR light of a wavelength of 0.1 to 0.4 mm, and FIG. 3C shows one for use in a detector operable under a magnetic field of 1 to 13 T and for an MW/FIR light of a wavelength of 0.35 to 10 mm;

FIGS. 4A to 4D are conceptual views of electrical transitions (magnetoplasma resonance) illustrating the excitation of an electron between states or levels by absorbing a single MW/FIR photon in a quantum dot under a magnetic field according to one aspect of the present invention wherein FIG. 4A shows an excitation between Landau levels by magnetoplasma resonance, FIG. 4B shows relaxation of an excited electron and positive hole into a stable state, FIG. 4C shows polarization in the quantum dot, and FIG. 4D shows a change $\Delta U$ in electrostatic potential and a change $\Delta \mu o \uparrow$ in electrochemical potential;

FIGS. 6A to 6D are conceptual views of magnetic transitions (magnetic resonance) illustrating the excitation of an electron between states or levels by absorbing a single MW/FIR photon in a quantum dot under a magnetic field according to another aspect of the present invention wherein FIG. 6A shows an excitation between spin states by magnetic resonance.

FIGS. 8A, 8A' and 8B are views, with an essential portion enlarged, illustrating a nodal region of a dipole antenna according to the present invention wherein FIG. 8A shows a configuration in which a second quantum dot of the A-type configuration is isolated by a gate electrode from a first quantum dot, FIG. 8A' shows a configuration in which a first quantum dot of the A-type configuration and an electronic mesa structure forming a second quantum dot are formed as isolated from each other.

FIGS. 9A, 9B and 9C are graphs illustrating examples of measurement each for a single MW/FIR detection wherein FIGS. 9A, 9B and 9C show dependency of the conductivity of a SET from the voltage applied to its control gate electrode, when there is no IFR light irradiated, when the electric current at a light emitting element is 2 $\mu$A, and when it is 3.5 $\mu$A, respectively:

FIGS. 10D to 10G are graphs illustrating examples of measurement each for a single MW/FIR detection and showing switching operations of a SET that operates upon absorbing a single photon wherein FIGS. 10D, 10E and 10F show such switching operations when the electric current at a light emitting element is 2 $\mu$A, 3 $\mu$A and 4 $\mu$A, respectively and FIG. 10G shows dependency of probabillity of excitation from the current at the light emitting element;

BEST MODES FOR CARRYING OUT THE INVENTION

Figure 1:
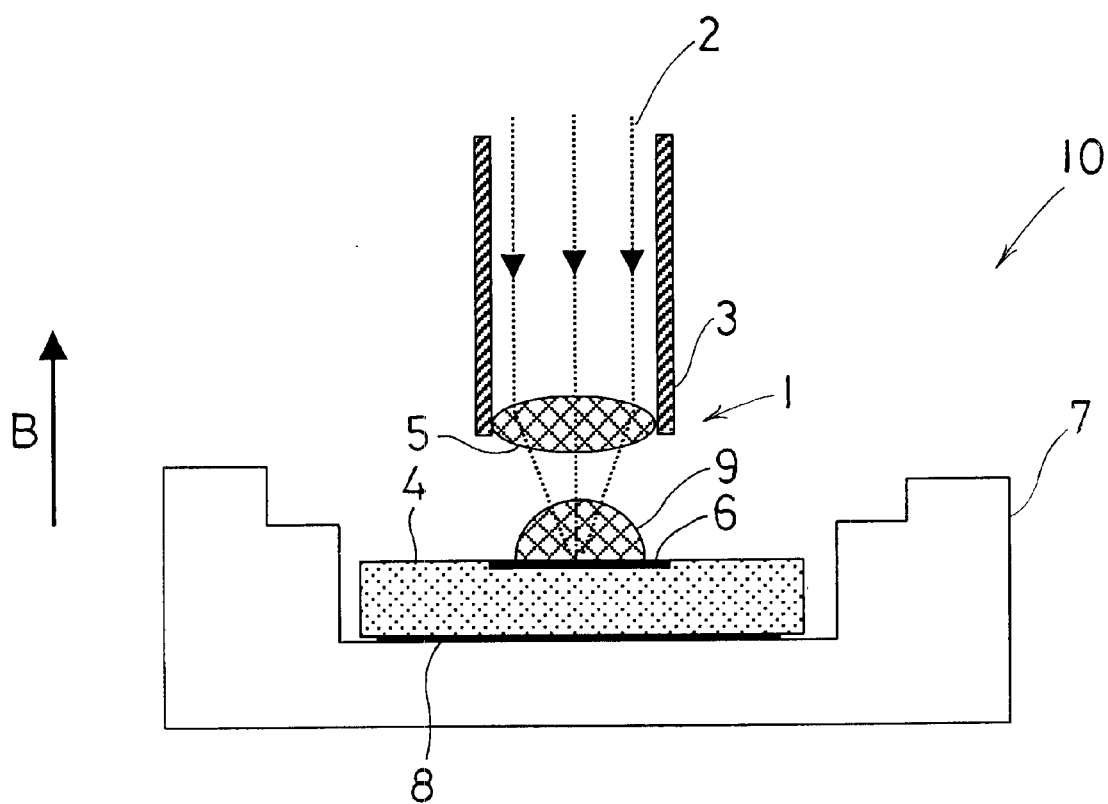
FIG. 1 is a cross sectional view diagrammatically illustrating the construction of an MW/FIR light detector according to this invention, the detector including a condenser or light-condensing system.

Hereinafter, the present invention will be described in detail with reference to suitable forms of embodiment thereof illustrated in the drawing figures.

A detailed description will first be given in respect of the construction of an MW/FIR light detector according to the present invention.

FIG. 1 is a cross sectional view diagrammatically illustrating the construction of an MW/FIR light detector according to this invention, the detector including a condenser or light-condensing system. As shown in FIG. 1, an MW/FIR light detector according to this invention includes a MW/FIR light introducing section 1 for guiding an incident MW/FIR light onto an antenna of the detector, a semiconductor substrate or board 4 formed thereon with a single-electron transistor that controls electric current passing through a semiconductor quantum dot, and a BOTAI (V-type) antenna 6 for concentrating the MW/FIR light into the semiconductor quantum dot that is constituted by a small special area of a sub-micros size formed in the single-electron transistor. The semiconductor board 4 is attached to a package 7 for IC chips. The MW/FIR introducing section 1 includes a light guiding pipe 3 that guides the MW/FIR light 2, a dielectric lens 5 for condensing the MW/FIR light 2, and a dielectric objective lens 9 that assists condensing.

For the dielectric objective lens 9 use is made of a semispherical silicon lens. The dielectric objective lens 9 is fixed in position as spaced away from the BOTAI antenna 6 and the surface of a semiconductor quantum dot to be described later so that it may not come to contact them directly. Further shown in FIG. 1 as formed on the back surface of the semiconductor substrate 4 is a back surface gate electrode 8 of the single-electrode transistor formed in the semiconductor substrate 4.

The MW/FIR light detector including the light introducing section 1 and indicated by reference character 10 in FIG. 1 is held cooled to a temperature of 0.3 K or lower. As required, a magnetic field B is applied to the semiconductor substrate 4 (i.e. to the quantum dot) in a direction perpendicular thereto.

Figure 2A:
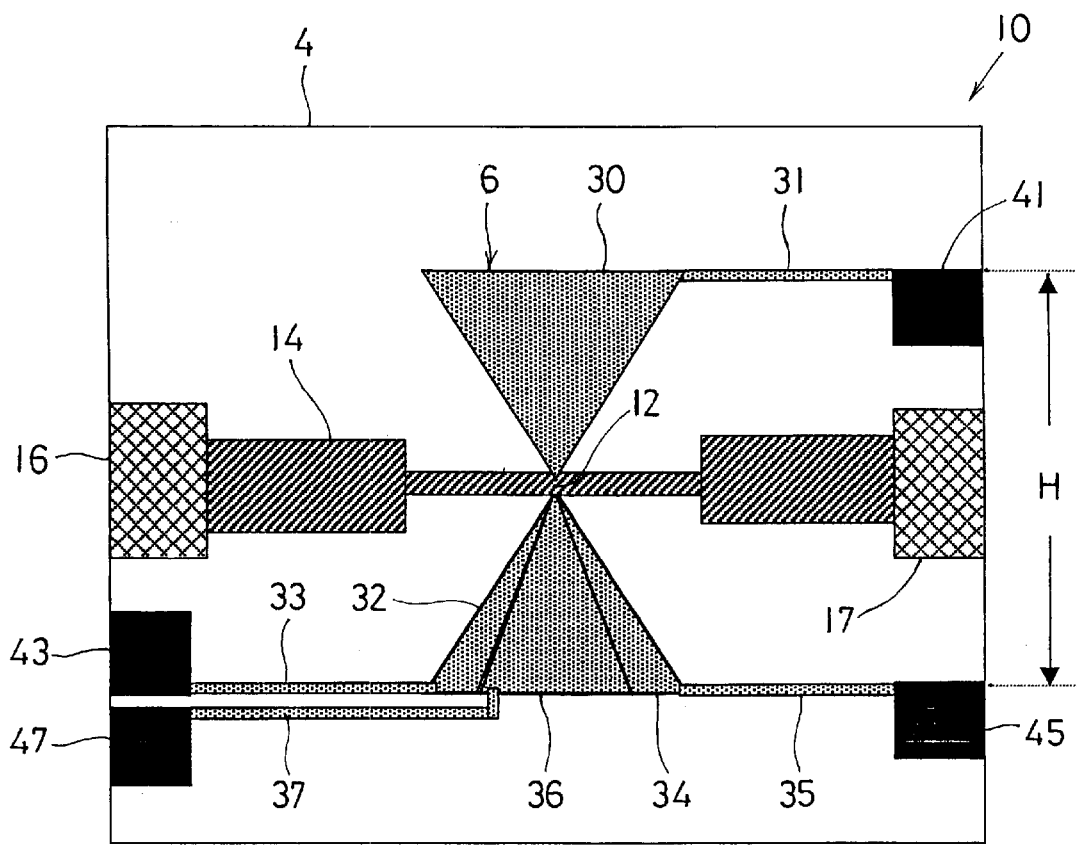
Figure 2B:
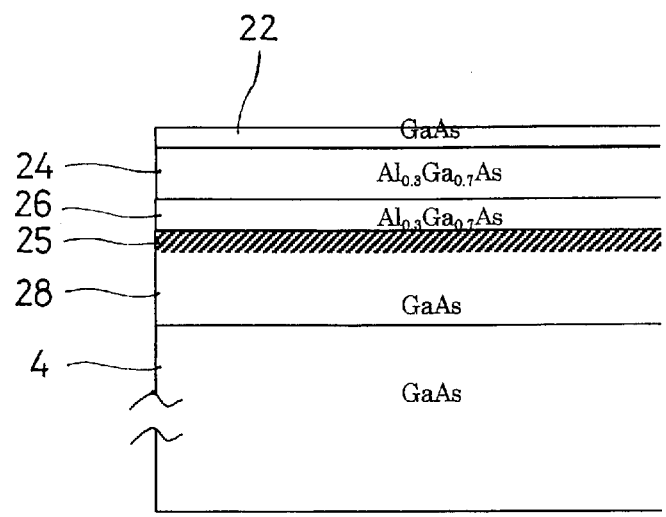

FIGS. 2A and 2B illustrate an MW/FIR light detector according to the present invention wherein FIG. 2A is a plan view of a single-electron transistor made of a BOTAI antenna and FIG. 2B is a partial diagrammatic view of a mesa structure. As shown in FIG. 2A, the MW/FIR light detector 10 according to the present invention has the BOTAI antenna 6, the semiconductor quantum dot 12 and the single-electron transistor 14 including the semiconductor quantum dot formed unitarily on the semiconductor substrate 4, and the single-electron transistor 14 is designed to draw a source-drain current therethrough under a given condition by means of ohmic electrodes 16 and 17. Further, the semiconductor substrate 4 has a thin metallic film vapor-deposited on a back surface thereof to provide an back surface gate electrode as mentioned previously.

The single-electron transistor 14 as shown in FIG. 2B structurally comprises the semiconductor substrate 4 of semi-insulating GaAs single crystal and a modulation doped GaAs/Al$_{0.3}$Ga$_{0.7}$As, single hetero structure stacked thereon, and has a mesa structure of the single-electron transistor 14 as shown in FIG. 2A formed using a lithography technique.

For the GaAs/Al$_{0.3}$Ga$_{0.7}$As single hetero structure, use is made of one having a two-dimensional electron mobility of 60 m$^2$/Vs or more at a temperature of 4.2 K, and an electron concentration of 2×10$^{15}$/m$^2$ to 2×10$^{15}$/m$^2$.

The hetero structure includes a GaAs layer 22 of a thickness of 10 nanometers with Si doped by 10$^{18}$/cm$^3$ from the crystal surface, an Al$_{0.3}$Ga$_{0.7}$As layer 24 having a thickness of 70 nanometers with Si doped by 1×10$^{18}$/cm$^3$, an Al$_{0.3}$Ga$_{0.7}$As spacer layer 26 having a thickness of 20 nanometers or more and a non-doped GaAs layer 28 having a thickness of 100 nanometers, which layers are selection doped and laminated by a molecular beam epitaxy process successively on the GaAs semiconductor substrate 4. A shaded portion 25 in FIG. 2B represents formation of an electron system, which has a thickness of 10 nanometers. The semiconductor 4 is made of a standard semi-insulating GaAs single crystal and has a total thickness of 0.5 mm and a planar size of 1 to 3 millimeters.

Mention is made in further detail of each of the components of an MW/FIR light detector according to the present invention. As shown in FIG. 2A, the single-electron transistor 14 including the semiconductor quantum dot 12 has a slender mesa structure of the two-dimensional electron system formed on the GaAs semiconductor substrate 4. The mesa structure has a region of its center formed to be as thin as 4 $\mu$m in width over a length of 200 $\mu$m so as to prevent an MW/FIR light from being excessively absorbed by a two-dimensional electron system outside of the semiconductor quantum dot 12 (as will be later described in detail). Thus, this central region at which a quantum dot is formed is narrower than the opposite two ends of the mesa structure. It is also desirable that the single transistor formed by a quantum dot be formed symmetrically about a quantum dot formed in the central region.

The mesa structure has at its opposite end portions a source electrode 16 and a drain electrode 17 each of which is formed as a standard ohmic electrode by alloying Au and Ge. The two electrodes are spaced apart from each other by a distance that is approximately equal to the length of the BOTAI antenna 6 so as not to hinder an electromagnetic wave condensing onto the semiconductor quantum dot 12. The BOTAI antenna 6 is formed of a vapor-deposited thin film of a metal and may, for example, be formed of Ti of 20 nanometers thick and Au of 60 nanometers thick. As shown in FIG. 2A, the BOTAI antenna 6 comprises a pair of equilateral triangular sections extending in opposite sides across the mesa structure formed to be as narrow as 4 μm in width of the single-electron transistor 14 and makes a node thereof in the central region of the mesa structure. The BOTAI antenna 6 has a length, i.e. an electrode diameter H that is about one half of the wavelength of the MW/FIR light to be measured. However, because lights are incident at various incident angles in the light, condensing process, the BOTAI antenna 6 is capable of detecting a light of the wavelength equal to 2H but also MW/FIR lights in a wide band.

In order to provide gate electrodes 32 and 34 and a control gate electrode 36 required to form the semiconductor quantum dot 12 as will be described later, the BOTAI antenna 6 has one of its vanes trisected. To allow a bias voltage to be applied to the gate electrodes 32, 34 and 36 so divided, these electrodes 32, 34 and 36 are connected via lead portions 33, 35 and 37, each of 5 to 10 μm in width, to metal pads 43, 45 and 47 (each formed of Ti of 20 nanometers thick and Au of 150 nanometers thick), respectively, which are enough distantly located. The other vane constitutes a gate electrode 30 that is connected to a metal pad 41 via a lead portion 31 of 6 to 10 μm in width.

To less affect the electromagnetic wave, the lengthwise direction of the lead portions 31, 33, 35 and 37 is perpendicular to a direction of the axis of polarization of the BOTAI antenna 6. Each of the ohmic electrodes 16 and 17 and the gate electrodes 30, 32, 34 and 36 is wired to a terminal of the standard IC chip package by utilizing such a pad portion and using a gold wire.

Figure 3A:
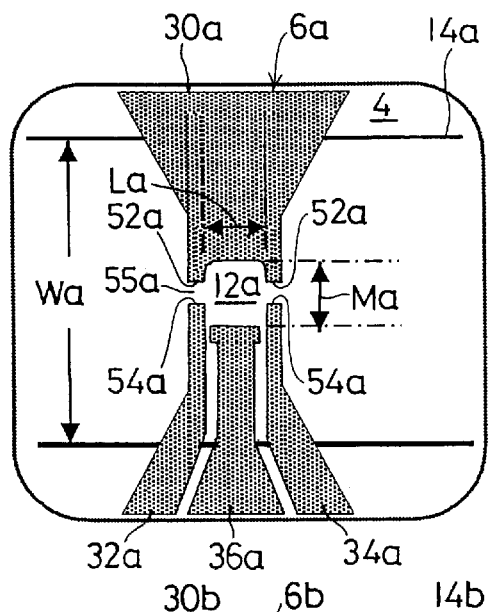
Figure 3B:
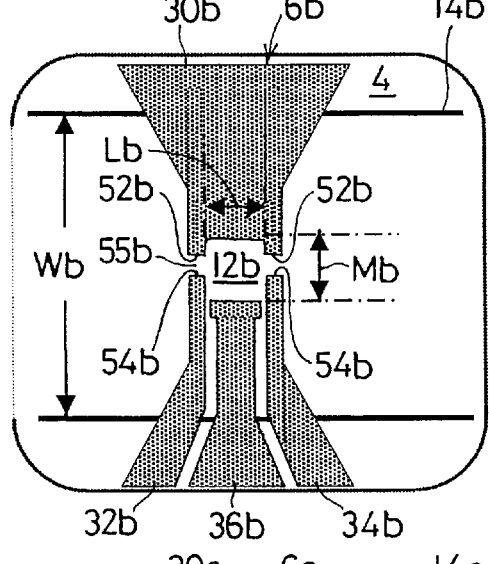
Figure 3C:
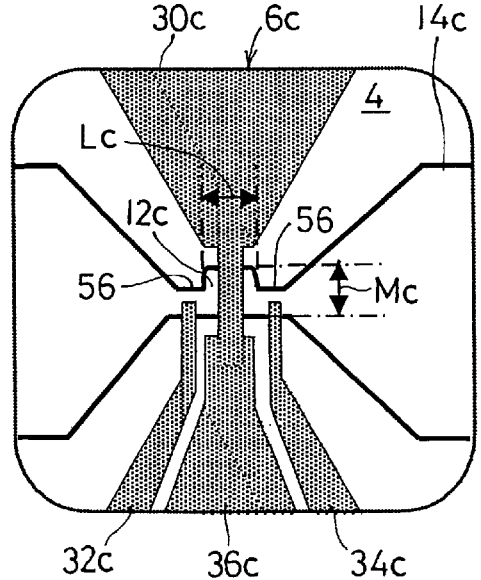

Mention is next made of the node of the BOTAI antenna described. FIGS. 3A, 3B and 3C diagrammatically illustrate a planar structure of a BOTAI antenna in a region of its node wherein FIG. 3A shows one for use in a detector operable with no magnetic field applied and for an MW/FIR light having a wavelength of 0.5 to 10 mm, FIG. 3B shows one for use in a detector operable under a magnetic field of 1 to 7 T and for an MW/FIR light of a wavelength of 0.1 to 0.4 mm, and FIG. 3C shows one for use in a detector operable under a magnetic field of 1 to 13 T and for an MW/FIR light of a wavelength of 0.3 to 10 mm. It should be noted here that T as a unit of magnetic flux density represents tesla.

As shown in FIGS. 3A, 3B and 3C, a quantum dot 12a, 12b, 12c is formed at the node of a BOTAI antenna 6a, 6b, 6c. For the presence or absence of a short circuit and the size of the quantum dot, it is desirable to use one of three patterns described below according to particular use or working conditions and a particular range of wavelength of an electromagnetic wave to be measured. It should be noted further in FIGS. 3A, 3B and 3C that reference characters 14a, 14b and 14c each designate a two-dimensional electron system's mesa structure.

First is the case of not using a magnetic field in which the range of wavelengths for detection is 0.5 to 10 mm, the BOTAI antenna is of a standard electrical coupling, and the electrode size of a quantum dot (the effective diameter of a two-dimensional electron system of the quantum dot) ranges between 0.2 and 0.4 μm (0.02 and 0.2 μm).

Second is the case of using a magnetic field in which a wavelength for detection lies in the range between 0.1 and 0.4 mm, the BOTAI antenna is of a standard electrical coupling, and the electrode size of a quantum dot (the effective diameter of a two-dimensional electron system of the quantum dot) ranges between 0.6 and 0.8 μm (0.4 and 0.6 μm).

Third is the case of using a magnetic field in which a wavelength for detection lies in the range between 3 and 10 mm, the BOTAI antenna is of node short-circuit magnetic coupling, and the electrode size of a quantum dot (the effective diameter of a two-dimensional electron system of the quantum dot) ranges between 0.6 and 0.8 μm (0.4 and 0.6 μm).

FIGS. 3A. 3B and 3C diagrammatically illustrate each a planar structure of BOTAI antenna in a region of its node, which applies to the first, second or third case mentioned above, respectively. It should be noted here that the nodal region of the antenna forming the quantum dot determines the electrode size of the quantum dot mentioned above. In the arrangement for the first case shown in FIG. 3A and for use with no magnetic field applied, the quantum dot 12a is electrically coupled to an electromagnetic wave via the BOTAI antenna 6a. The wavelength of an electromagnetic wave that can be measured ranges between 0.5 and 19 mm. With no magnetic field applied, the life of the quantum dot 12a in its excited state is as comparatively short as 10 nanoseconds to 1 microsecond, and use is then made of a current amplifying circuit that as mentioned above comprises a HEMT amplifier cooled to a helium (liquefier, refrigerator or cooling) temperature in combination with an LC tank circuit to detect a single photon.

On of the vanes of the BOTAI antenna 6a is trisected to provide gate electrodes 32a, 34a and 36a, and its other vane is designed to provide a gate electrode 30a. The gate electrode 30a is formed at its forward end with a pair of projections 52a and 52a each of which has a width of 0.15 μm. Likewise, the gate electrode 32a and 34a are formed to have their respective projecting ends 54a and 54a each of which has a width of 0.15 μm. And, each pair of opposed projections here are spaced apart from each other across a spacing 55a of 0.15 μm. Further in FIG. 3A, Wa, La and Ma are set at 2 μm, 0.4 μm and 0.35 μm, respectively.

Biasing the three gate electrodes 32a, 34a and 30a with a negative voltage of −0.6 V and the gate electrode 36a with a negative voltage of −0.2 to −3 V depletes the two-dimensional electron system below the gate electrodes and confines the two-dimensional electron system inside the square area of 0.3 μm side in the center, where the quantum dot 12a is thereby formed. However, fine adjustment is here made of the bias voltages applied to the gate electrode 34a and 30a so that the quantum dot is weakly tunnel coupled to the two-dimensional electron system in its outside. And with the gate electrode 36a used to act as a control gate electrode, there is now formed a single-electron transistor constituted by a quantum dot. Changing the bias voltage to the control gate electrode $V_{CG}$ from −0.2 V to −3 V causes the effective diameter of the two-dimensional electron system in the quantum dot to vary from about 0.2 μm to 0.02 μm.

Referring next FIGS. 3B and 3C, mention is made of arrangements for use by applying magnetic fields of 1 to 7

T and 4 to 13 T, respectively. If a magnetic field is applied, the life of a quantum dot in its excited state is permitted to reach as long as 1 milliseconds to 1000 seconds depending on the field value and the electron concentration in the quantum dot, and it is made possible to detect a single photon without using the high speed amplifier circuit, and with extreme ease. In the arrangement for the above-mentioned second case shown in FIG. 3B, the quantum dot is electrically coupled to an electromagnetic wave via the BOTAI antenna 6b, and the wavelength of an electromagnetic wave that can be measured here ranges between 0.05 mm and 0.4 mm. The geometrical construction of gate electrodes that make up the BOTAI antenna 6a and their respective roles are identical to those in the arrangement of FIG. 3A, but their sizes differ as stated below. Thus, the two projections 52b and 52b of the gate electrode 30b are each formed to have a width of 0.3 $\mu$m, and the respective projecting ends 54b and 54b of the gate electrodes 32b and 34b are each likewise formed to have a width of 0.3 $\mu$m. And, each pair of opposed projections here are like-wise spaced apart from each other across a spacing 55b of 0.3 $\mu$m. Further in FIG. 3B, Wa, La and Ma are set at 4 $\mu$m, 0.7 $\mu$m and 0.7 $\mu$m, respectively. With a two-dimensional electron system confined inside the square area of 0.7 $\mu$m side in the center, a quantum dot having an effective diameter of 0.4 to 0.7 $\mu$m is formed. And with the gate electrode 36b serving as a control gate electrode, there is now formed a single-electron transistor constituted by a quantum dot. And, the bias voltage $V_{CG}$ of the control gate electrode is varied from −0.3 V to −1.5 V.

In the arrangement, for the above-mentioned third case shown in FIG. 3C, the quantum dot is magnetically coupled to an electromagnetic wave via the BOTAI antenna 6c, and the wavelength of an electromagnetic wave that can be measured here ranges between 3 mm and 10 mm. The width of the mesa structural portions for the two-dimensional electron system, Lc and Mc are each set at 0.7 $\mu$m. Further, a pair of constrictions 56 and 56 having each a width of 0.4 $\mu$m are formed each at a place that is spaced at a distance of 0.7 $\mu$m from each of these portions, respectively.

One of the vanes of the BOTAI antenna 6c are trisected to provide three gate electrodes 32c, 34c and 36c, of which one gate electrode 36c is short circuited via a bridge of 0.2 $\mu$m in width to a gate electrode 30c formed by the other vane of the BOTAI antenna 6c. Biasing the gate electrode 32c and the gate electrode 34c each with a negative voltage confines a two-dimensional electron system within an area of about 0.8 $\mu$m side defined by the constrictions 56 and 56 and the gates electrodes 32c and 34c, thereby forming a quantum dot 12c having an effective diameter of 0.4 to 0.6 $\mu$m. And with gate electrode 36c used to serve as a control gate electrode, there is now formed a single-electron transistor constituted by a quantum dot. The bias voltage $V_{CG}$ to the control gate electrode is here varied from +0.1 V to −0.1 V so as not to change much the electron density in the quantum dot.

An explanation is next given in respect of operations of the MW/FIR light detector according to the present invention. The details of forms of embodiments and their respective operations vary for the first, second third cases mentioned above.

Mention is first made of an operation of the arrangement for the first case shown in FIG. 3a. In the first case, the quantum dot is small in size and contains as small in number as 10 (ten) to 50 (fifty) of conduction electrons, and its electron's energy level is therefore split into discrete energy levels $\epsilon_n$ as a result of its size effect and by exchange interaction.

First, adjustment is made of the control gate voltage $V_{CG}$ so that the energy splitting in the neighborhood of the Fermi level, $\Delta\epsilon_{nm}=\epsilon_n-\epsilon_m$, satisfies the following resonance conditions for an MW/FIR light to be measured:

$$\omega = 2\pi\Delta\epsilon_{nm}/h \tag{1}$$

where $\omega$ is an angular frequency of the MW/FIR light to be measured, and h is the Plank's constant.

In general, $\epsilon_{nm}$ is inversely proportional to the square of the effective diameter of the quantum dot. For example, it follows therefore that $V_{CG}=-3$ V to −2 V (the quantum dot's effective diameter of about 0.02 $\mu$m) for the MW/FIR light having a wavelength of 0.5 mm and $V_{CG}=-0.5$ V to −0.2 V (the quantum dot's effective diameter of about 0.2 $\mu$m) for the MW/FIR light having a wavelength of 10 mm.

Then, the SET is placed in a state that its conductivity is at maximum. That is to say, even if a source-drain voltage $V_{SD}$ (100 $\mu$V or less) is applied across the two ohmic electrodes in FIG. 2, normally the Coulomb occlusion that is created prevents current $I_{SD}$ from flowing between the source and drain electrodes. However, finely varying the bias voltage $V_{CG}$ applied to the gate electrode 36a shown in FIG. 3A allows Coulomb oscillations to develop in which a finite $I_{SD}$ with a sharp peak appears each time the $V_{CG}$ varies by from 3 mV to 20 mV.

The $V_{CG}$ is finely adjusted so as to meet with one peak position of the $I_{SD}$ and then fixed. Such fine adjustment of the $V_{CG}$ does not materially affect the resonance conditions expressed by the equation (1). Then, making the MW/FIR light for measurement incident in a peak state of the Coulomb oscillations causes the incident MR/FIR light by the BOTAI antenna to create an oscillating electric field in a region of the quantum dot and to bring about an electron resonance excitation $\epsilon_n \rightarrow \epsilon_m$.

Since the state of excitation in general has a space symmetry of an electron's wave function varying from that in the bound state, both the tunnel coupling strength and the electrochemical potential of the quantum dot here change; thus a change as large as 10% to 90% takes place in the conductivity G of the SET. Such a change in the conductivity that lasts generally for a period of 10 nanoseconds to 1 microsecond until the excitation ceases to exist by photon emission is measured by the high-speed current amplifier.

Figure 4A:
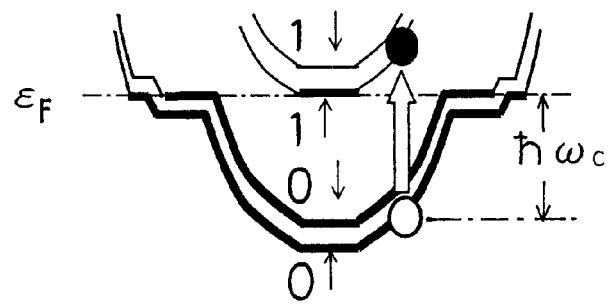
Figure 4B:
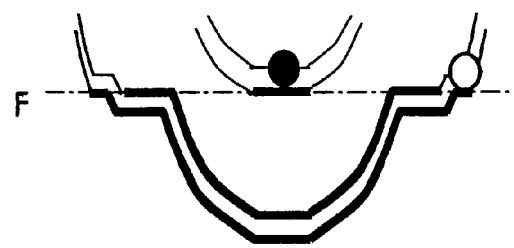
Figure 4C:
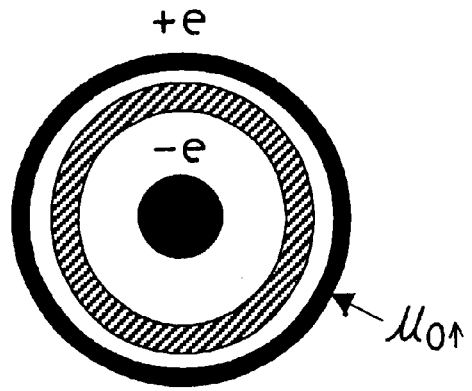
Figure 4D:
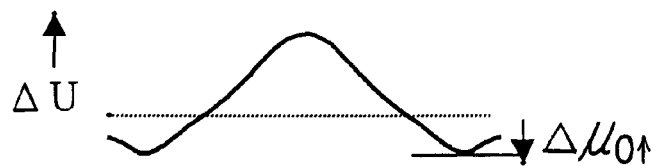

Mention is next made of an operation of the arrangement for the second case shown in FIG. 3B. FIGS. 4A to 4D are conceptual views of electrical transitions (magnetoplasma resonance) illustrating the excitation of an electron between states or levels by absorbing a single MW/FIR photon in a quantum dot, under a magnetic field according to one aspect of the present invention wherein FIG. 4A shows an excitation between Landau levels by magnetoplasma resonance, FIG. 4B shows relaxation of an excited electron and positive hole into a stable state. FIG. 4C shows polarization in the quantum dot, and FIG. 4D shows a change $\Delta U$ in electrostatic potential and a change $\Delta\mu_0\uparrow$ in electrochemical potential. In FIG. 4A, numerals 2 and 1 indicate energy levels, the arrow $\uparrow$ indicates an up spin and the arrow $\downarrow$ indicates a down spin.

In the case of the second case, while the quantum dot is large in size, contains conduction electrons that are as large in number as 200 (two hundreds) to 400 (four hundreds) and thus have a small size effect $\Delta\epsilon_{nm}$ on the electron energy levels, applying a magnetic field thereto splits its energy structure into Landau levels with a spacing of $(h/2\pi)\omega_c \approx (h/2\pi)eB/m^*$, where $\omega_c$ represents an angular frequency taken when the energy splitting in the neighborhood of the Fermi level satisfies the resonance conditions for an MW/FIR light to be measured, e is the quantum of electricity or elementary charge that is equal to $1.6 \times 10^{-19}$ Coulomb, B is a magnetic flux density, m* is the effective mass that is equal to 0.068 m, and m is the mass of an electron.

In the case of the second case, an magnetic filed is applied such that the angular frequency ($\omega$) of the MW/FIR light for measurement satisfied the resonant conditions including plasma oscillation, expressed by the following equation $$\omega = [\omega_p^2 + (\omega_c/2)^2]^{1/2} + (\omega_c/2) \qquad (2)$$

where $\omega_p$ is an plasma angular frequency of the quantum dot, which can be expressed with a plasma wavelength $\lambda_p = 2\pi c/\omega_p$ that becomes about 0.43 mm for the quantum dot shown in FIG. 3B, where c is the speed of a light.

A magnetic field that concretely satisfies the equation (2) becomes generally that of a field strength of B=6 to 7 T for an MW/FIR having a wavelength of 0.1 mm and that of a field strength of B=1 to 1.5 T for an MW/FIR light having a wavelength of 0.4 mm, where T is a unit of magnetic fields and represents tesla.

Next, in the same manner as described for the aforementioned first case, the SET is placed in a peak state of Coulomb oscillations and an MR/FIR light for measurement is made incident. The incident MR/FIR light then creates an oscillatory electric field in the quantum dot via the BOTAI antenna and brings about, resonant excitation of an electron across the Landau levels as indicated by the arrow in FIG. 4A and thus magnetoplasma resonance. The electron excited is shown in FIG. 4A as indicated by the black circle together with a positive hole excited as indicated by the blank circle. They are relaxed in a time period of 10 nanoseconds as shown in FIG. 4B each by losing an excess energy in the lattice system. Then, the electron and positive hole moving into the inside and to the outside of the quantum dot, respectively under the influence of an electrostatic potential that makes up the quantum dot, and being thus spatially isolated from each other, there is created an annular polarization in the inside of the quantum dot. As a result, the electrochemical potential of the electron level of outermost shell of the quantum dot is caused to vary by a variation in the electrochemical potential by polarization, viz. $\Delta U = 30$ to $60\ \mu eV$.

This in turn changes the operating state of the SET from the state that its conductivity G is at maximum to the Coulomb closure state, i.e., the state that G≈0. The conduction blocking state lasts until the electron and positive hole recombine in the quantum dot. The life before recombination here is long with the electron and positive hole spatially isolated, in which time period a single photon can be detected with ease. In this case, it is possible to establish a particularly long life of the state by adjusting the control bias voltage $V_{CG}$ and the bias voltage to the back surface gate (see FIGS. 1 and 3), thereby so controlling the mean electron concentration $N_d$ in the quantum dot that the index of occupation of a Landau level v takes values each in the neighborhood of an even number such as v=2.4 to 1.9, 4.6 to 4.0, 6.6 to 6.0 and so on.

Here, the index of occupation of a Landau level can be expressed by the following equation:

$$v = N_d/(2\pi eB/h)$$

Figure 5A:
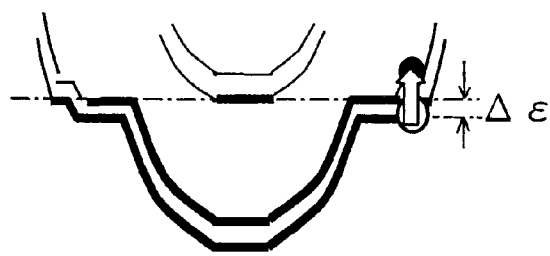
FIG. 5B shows relaxation of an excited electron and positive hole into a stable state.
FIG. 5C shows polarization in the quantum dot.
FIG. 5D shows a change $\Delta U$ in electrostatic potential.
Figure 5B:
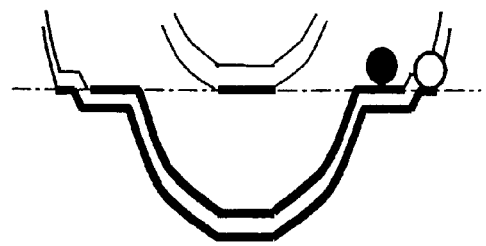
Figure 5C:
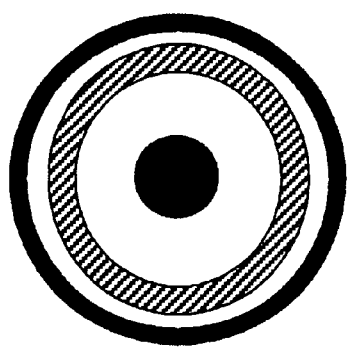
Figure 5D:
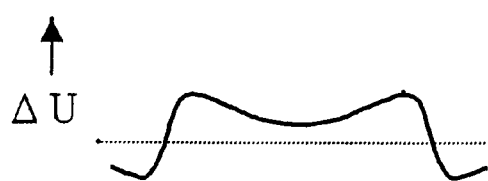

Next, mention is made of an operation of the arrangement, for the third case shown in FIG. 3C. FIGS. 5A to 5D are conceptual views of magnetic transitions (magnetic resonance) illustrating the excitation of an electron between states or levels by absorbing a single MW/FIR photon in a quantum dot under a magnetic field according to another aspect of the present invention wherein FIG. 5A shows an excitation between spin states by magnetic resonance, FIG. 5B shows relaxation of an excited electron and positive hole into a stable state, FIG. 5C shows polarization in the quantum dot, and FIG. 5D shows a change $\Delta U$ in electrostatic potential In the third case as in the second case, the quantum dot has a small size effect, and in addition to splitting into a Landau level, the application of a magnetic field thereto brings about magnetic energy separation by taking spin states, as expressed by $\Delta \epsilon_M = g^* \cdot \mu_B B$ as indicated in FIG. 5A, where g* is an effective g factor and $\mu_B$ is the Bohr magneton.

First, a magnetic field is applied such that the resonance conditions expressed by the following equation are satisfied for an MW/FIR light to be detected.

$$\omega = 2\pi \epsilon_M/h \qquad (4)$$

where the effective g factor is approximately g*=0.44.

Next, as in the manner for the aforementioned first case, the SET is placed in a peak state of the Coulomb oscillations, and the MW/FIR light is made incident. The incident MW/FIR light produces an oscillatory current in the short-circuited nodal point of the BOTAI antenna and creates an oscillatory magnetic field in the quantum dot. As a result, as indicated by the arrow in FIG. 5A a magnetic resonance excitation of an electron is brought about. The excited electron and positive pole as shown in FIG. 5B are relaxed in a time period of 10 nanoseconds each by losing an excess energy in the lattice system. Then, under the influence of an electrostatic potential that makes up the quantum dot, the electron and the positive hole each in the quantum dot are spatially isolated from each other. As a result, the electrochemical potential of the electron level of outermost shell of the quantum dot is caused to vary by a variation in the electrochemical potential by polarization, viz. $\Delta U = 10$ to $50\ \mu eV$.

This in turn changes the operating state of the SET from the state that its conductivity G is at maximum to the Coulomb closure state i.e., the state that G≈0. The conduction blocking state lasts until the electron and positive hole recombine in the quantum dot. The life before recombination here is long with the electron and positive hole spatially isolated, in which time period a single photon can be detected with ease.

Now, an explanation is given in respect of another form of embodiment of the present invention in which a plurality of quantum dots are had.

As mentioned before, in case a single quantum dot is had, the life of the state of excitation is as relatively short as 1 microsecond or less unless a magnetic filed is applied thereto. Accordingly, to enable detecting a single photon, it is then necessary either to adopt a current amplifier that includes a HEMT amplifier cooled to a helium (liquefier, refrigerator or cooling) temperature in combination with an LC tank circuit or to utilize a magnetic field, in order to prolong the life of the state of excitation to 1 millisecond or more. However, in this alternative form of embodiment having more than one quantum dot, a rise in sensitivity is achieved without using a magnetic field.

An MR/FIR light detector according to the alternative form of embodiment comprises a first and a second conductive quantum dot electrostatically coupled to each other, each of the quantum dots being a sub-micron size. The first quantum dot is designed to absorb an electromagnetic wave and the second quantum dot is operable as a single-electron transistor (SET), the SET detecting absorption of the electromagnetic wave by the first quantum dot.

Figure 6:
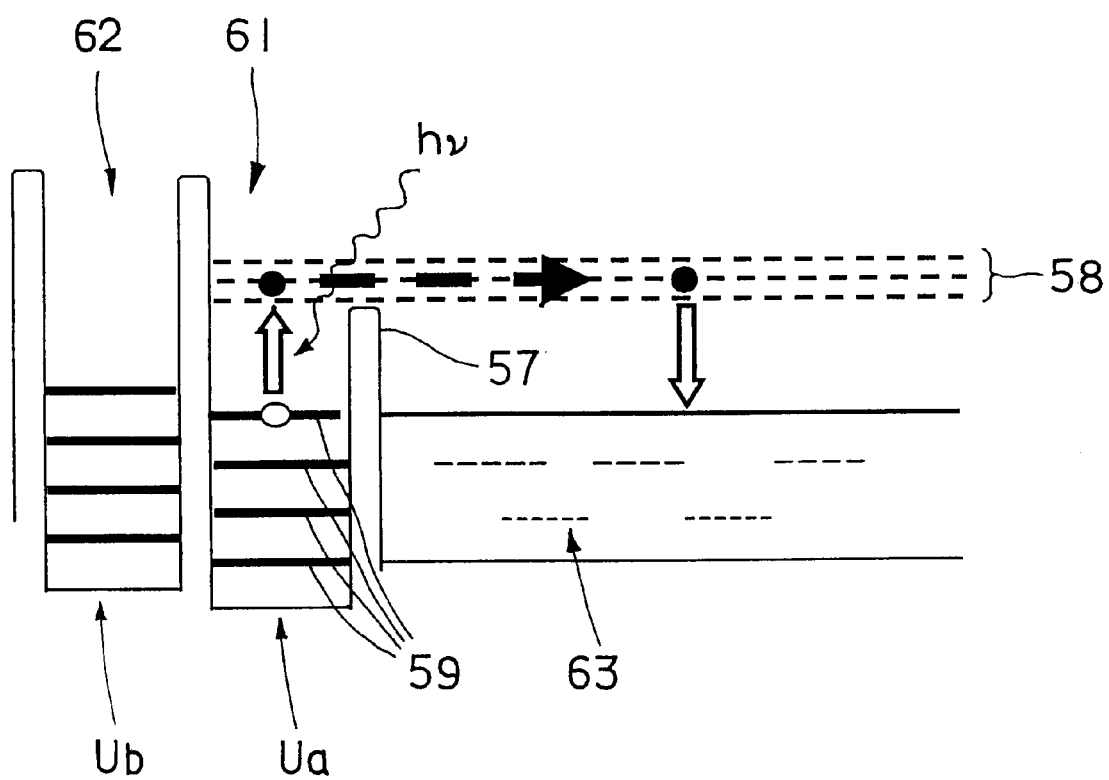
FIG. 6 is a conceptual view illustrating the operating principles of a detector according to another form of embodiment of the present invention.

Its operating principles are set forth below with reference to the conceptual view of FIG. 6. FIG. 6 is a conceptual view illustrating the operating principles of a detector according to this alternative form of embodiment of the present invention.

For the first quantum dot that is indicated at 61 and shown as characterized by an electrostatic potential Ua, use may be made of a quantum dot having an effective size represented by a diameter of 0.02 $\mu$m to 0.3 $\mu$m. This permits as shown in FIG. 6 the state for an electron having an amount of energy lower than a threshold value of energy determined by an applied gate voltage and hence than an ionization energy to be quantized, and discrete bound levels 59 to be formed in the first quantum dot 61.

On the other hand, the states for electrons having amounts of energy greater than the threshold value assume a continuous free energy level 58, the electrons being those of an electron system 63 spreading out externally of the first quantum dot 1.

This ionization energy if converted into voltage, according to the height of a potential barrier 57 that forms the first quantum dot 61, may take a value of 100 $\mu$m to 20 mV. This height of the potential barrier 57 can be controlled by a bias voltage applied to a gate electrode of the first quantum dot 61. Therefore, as indicated by the arrow in FIG. 6, irradiating the first quantum dot 61 with an MW/FIR light having an amount of electromagnetic photon energy greater than the ionization energy can excite an electron in the first quantum dot 61 from a discrete bound level 59 to a continuous free level 58 of the electron system 63 outside of the potential barrier 57. Further, shown and indicated by a black and a white circle are an electron and a positive hole or hole devoid of an electron, respectively.

The electron excited to the continuous free level 58 gets out of the potential barrier 57 of the first quantum dot 61 quickly into the external electron system 63 within a time period of 1 nanosecond. The first quantum dot 61 is then charged positively by an elementary charge of +e and is thus ionized.

On the other hand, the electron that comes out of the potential barrier 57 is relaxed quickly in a time period of 10 nanoseconds at the Fermi level of the electron system 63 on losing excess energy by reason of electron-electron and electron-lattice interactions. Hindered by the potential barrier 57, it cannot return into the first quantum dot. Therefore, the ionized state of the first quantum dot 61 lasts for long, e.g., for a time period of 10 microseconds to 1000 seconds.

The second quantum dot, indicated by 62 in FIG. 6, is disposed adjacent to the first quantum dot 61 and has an electrostatic potential Ub that confines an electron at a discrete level, thus forming a SET. The second quantum 62 can be made of either semiconductor or metal quantum dot. Although the second quantum dot 62 is not electrically conductive to the first quantum dot 61, they are adjacent to each other via the potential barrier and hence are electrostatically coupled together. Thus, charging and hence ionizing the first quantum dot 61 causes the electrostatic potential of the second quantum dot 62 and hence the conductivity of the SET to vary largely, for example as largely as 20% to 99%. In this case, the state that the conductivity has changed lasts until the first quantum dot 61 de-ionized and returns to its neural sate.

On the other hand, the life of the ionized state of the first quantum dot 61 as long as 10 microseconds to 1000 seconds as mentioned above provides extremely high sensitivity for the detector. In particular, a single MW/FIR photon can be detected through time resolution current measurement.

Next, mention is made of the construction of the alternative form of the present invention mentioned above. An MW/FIR light detector according to this form of embodiment provides two suitable, further specific forms of embodiment. While the alternative form of embodiment being described is basically the same in construction as that shown in and described in connection with FIGS. 1 and 2, it is differentiated by including a pair of quantum dots electrostatically isolated from each other, of which a first quantum dot for absorbing an electromagnetic wave is formed in the nodal region of a dipole antenna that serves as a gate electrode, too, and a second quantum dot that detects absorption of the electromagnetic wave by the first quantum dot and forms an SET.

Figure 7A:
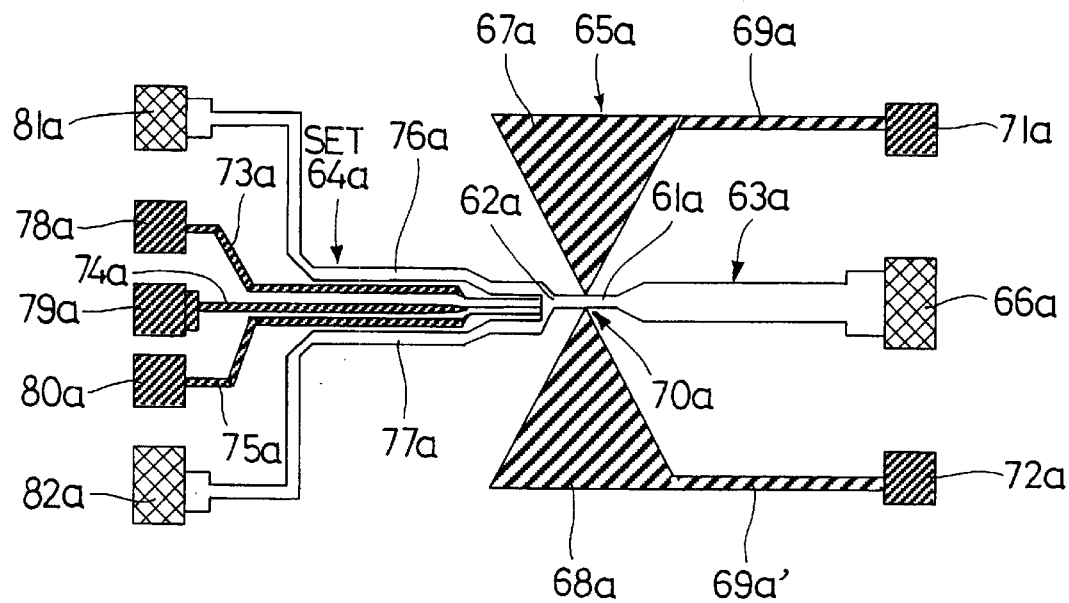
FIGS. 7A and 7B illustrate an MW/FIR detector according to that form of embodiment of the present invention wherein FIG. A is a plan view showing an A-type configuration and FIG. B is a plan view showing a B-type configuration.
Figure 7B:
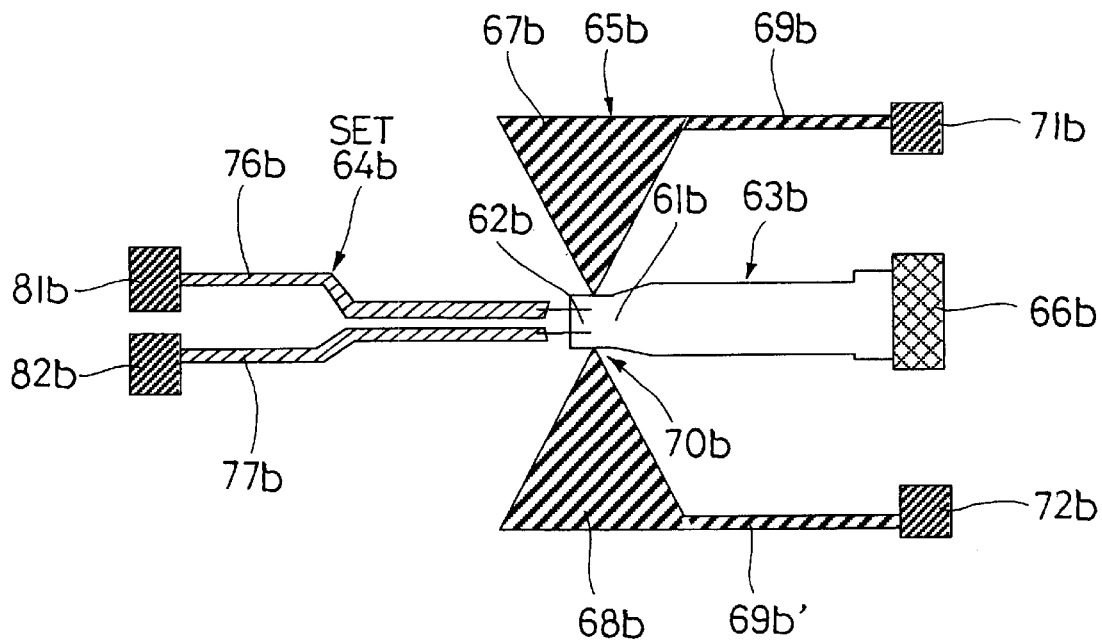

FIGS. 7A and 7B illustrate an MW/FIR detector according to this alternative form of embodiment of the present invention wherein FIG. A is a plan view showing an A-type configuration and FIG. B is a plan view showing a B-type configuration. In either the structure, the first quantum dot is electrically coupled to an electromagnetic wave via the dipole antenna. Referring to FIGS. 7A and 7B, an MR/FIR light detector according to this alternative form of embodiment as in that shown in FIG. 2B makes use of the lithography technique applied on a modulation doped GaAs/Al$_{0.3}$Ga$_{0.7}$As, single hetero structure, in forming either the A-type or B-type configuration. Further, both the A-type and B-type configurations are each formed into a given symmetrical configuration by mesa-etching the hetero structure of the electron system. In this connection it should be noted that an equivalent structure can also be prepared by applying the lithography technique to a IV group semiconductor, for example to a Si substrate.

As will also be seen, one of the vanes 67a, 67b for the dipole antenna 65a, 65b and the other vane 68a, 68b are connected via a metal lead wire 69a, 69b and a metal lead wire 69a', 69b to a metal pad 71a, 71b and a metal pad 72a, 72b, respectively. As illustrated in this form of embodiment, each of the metal lead wires and the metal pads is prepared by alloying together Ti of 20 nanometers thick and Au of 150 nanometers thick.

As shown in FIG. 7A, the A-type configuration is so formed that its mesa structure of electron system 63a is constricted in a nodal region 70a of a dipole antenna 65a and a pair of further mesa structures of electron system 76a and 77a are formed as bifurcated from the nodal region 70a. The electron system mesa structure 63a has its base end formed with an ohmic electrode 66a and the bifurcated other ends formed with ohmic electrodes 81a and 82a, respectively, which are to become a source and a gate electrode, respectively, of a SET 64a to be described later.

A first and a second quantum dot 61a and 62a are formed in the nodal zone of the dipole antenna 65a. The dipole antenna 65a couples the first quantum dot 61a to an electromagnetic wave in its nodal zone 70a. Further, the first quantum dot 61a is isolated from an electron system outsides of the quantum dot, by an electrostatic potential barrier that is formed by the forward ends of a gated electrode 67a served as one vane of the dipole antenna 65a and of a gate electrode 68a served as the other vane.

The second quantum dot 62a lying in the electron system is formed adjacent to the first quantum dot 61a. The second quantum dot 62a is so formed as to have a bias voltage applied thereto through a metal lead wire 73a, 74a, 75a from a gate electrode 78a, 79a, 80a, respectively, and is weakly tunnel coupled to the respective electron systems of the electron system mesa structures 76a and 77a.

The second quantum dot, 62, the electron system mesa structures 76a and 77a, and the ohmic electrodes 81a and 82a constitute the SET 64a.

It should further be noted that the metal lead wires 73a, 74a and 75a are connected to the gate electrodes 78a, 79a and 80a, respectively. Also in the form of embodiment illustrated, the ohmic electrodes 66a, 81a and 82a are formed each by Au/Ge alloying.

Further, the electron system (electronic) mesa structure 63a (including the electronic mesa structures 76a and 77a) and the metal lead wires 69a, 69a', 73a, 74a and 75a each for applying a bias voltage to a gate as described are each formed to be 5 μm or less in width so that they may not absorb an electromagnetic wave, and also each to be longitudinally perpendicular to the direction of the axis of the dipole antenna 65a.

Now, an MW/FIR light detector of the B-type configuration shown in FIG. 7B has an electronic mesa structure 63b a constricted end of which is located in a nodal region 70b of a dipole antenna 65b, and in that region 70b is there formed a first quantum dot 61b. Here, the dipole antenna 65b and the first quantum dot 61b are each constructed in the same manner as in the A-type configuration.

Further, the second quantum dot 62b in the MR/FIR light detector of the B-type configuration is formed from a metal films provided on an upper surface of the first quantum dot 61b. The second quantum dot 62b is electrostatically coupled to the first quantum dot 61b, but its electrical conduction (by tunnel junction) is cut off. The second quantum dot 62b formed by the metal film is weakly tunnel coupled to each of metal lead wires 76b and 77b, which are connected to a source and drain electrode 81b and 82b, respectively. A SET 64b is thus provided.

Figure 8A:
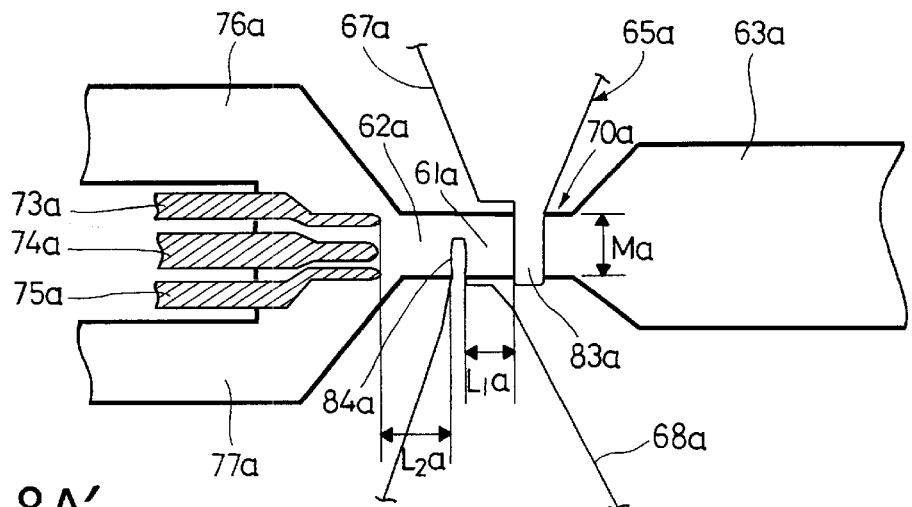
Figure 8A:
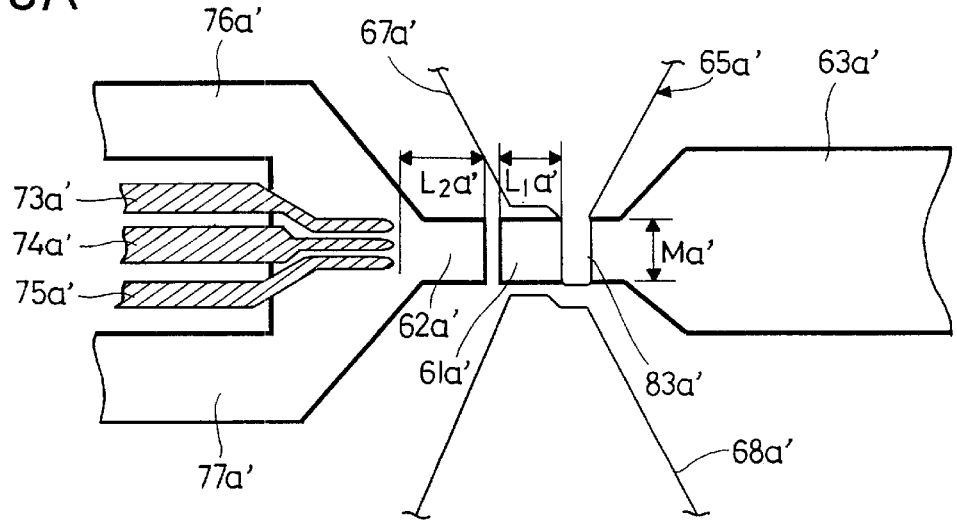
Figure 8B:
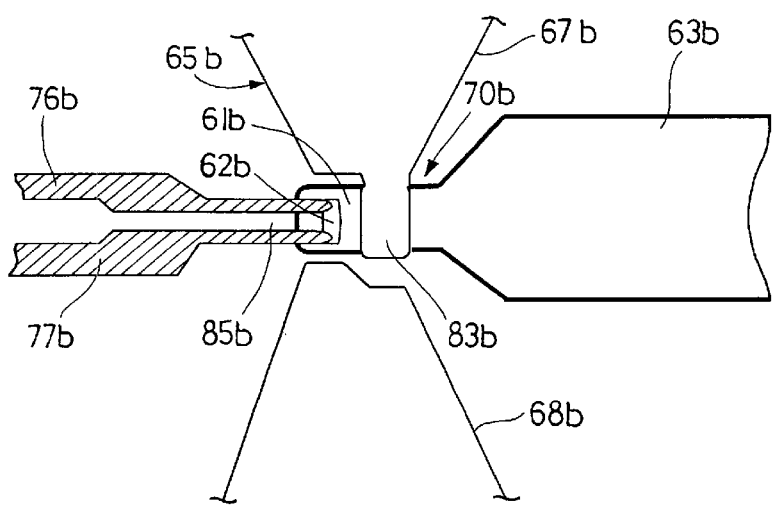
FIG. 8B is a view, with an essential portion enlarged, showing the B-type configuration.

Next, mention is made in detail of a dipole antenna, and a first and a second quantum dot. FIGS. 8A, 8A' and 8B are views, with an essential portion enlarged, illustrating a nodal region of a dipole antenna according to the present invention wherein FIG. 8A shows a configuration in which a second quantum dot of the A-type configuration is isolated by a gate electrode from a first quantum dot, FIG. 8A' shows a configuration in which a first quantum dot of the A-type configuration and an electronic mesa structure forming a second quantum dot are formed as isolated from each other, and FIG. 8B is a view, with an essential portion enlarged, showing the B-type configuration.

Referring to FIG. 8A, the first quantum dot 61a is established at a gap formed between a projection 83a of the gate electrode 67a and a projection 84a of the gate electrode 68a when a bias voltage is applied across these electrodes. This gap, indicated by $L_1a$, is of a size of about 0.5 μm. The electronic mesa structure 63a in the nodal region 70a has a width Ma ranging from 0.4 μm to 0.5 μm.

The second quantum dot 62a is established at a gap formed between a projection 84a of the gate electrode 68a and a projection of each of the metal lead wires 73a, 74a and 75a extending from the other gate electrodes, respectively, when a bias voltage is applied across them. The gap, indicated by $L_2a$, is of a size ranging between 0.3 μm and 0.5 μm.

The gate electrodes 67a and 68a also serving to form the two vanes of the dipole antenna 65a, respectively, together play a role as well to couple an electromagnetic wave electrically to the first quantum dot 61a.

The projection 83a is 0.3 μm wide and 0.7 μm long and is so formed as to extend through the nodal region 70a, while the projection 84a is 0.1 μm wide and 0.3 μm long is so formed as not to extend through but to partly extend into the nodal region. This is to maintain electrostatic coupling of enough size between the first and second quantum dots 61a and 62a. However, applying a negative bias voltage to the gate electrode 68a (projection 84a) cuts off or blocks electrical conduction (by tunnel junction) between the first and second quantum dots 61a and 62a.

In the present form of embodiment illustrated, the metal lead wires 73a, 74a and 75a extending from the gate electrodes have their respective forward ends each of which is 0.1 μm wide, and are mutually spaced apart by a spacing of a size of 0.1 μm.

Biasing the gate electrode 67a with a negative voltage of −0.3 V to −2 V and the gate electrode 68a with a negative voltage of −0.7 V forms the first quantum clot 61a.

The second quantum dot 62a is formed by biasing the gate electrode metal lead wire 73a, 75a with a negative voltage of −0.7 V and the gate electrode metal lead wire 74a with a negative voltage of −0.3 V to −0.7 V.

It should be noted here that it is the bias voltage to the gate electrode 67a (projection 83a) that determines the ionization energy of the first quantum dot 61a in absorbing an electromagnetic wave. For example, the voltage of −0.3 V represents the ionization energy of 0.2 meV that corresponds to a threshold detection wavelength of 5 mm. The value of ionization energy then varying continuously with changing negative voltage reaches 30 meV at −2 V, at which a threshold detection wavelength of about 30 μm is reached.

In order to enable the second quantum dot 62a to operate as the SET 64, fine adjustment is made of the bias voltages to the metal lead wires 73a and 75a to cause the second quantum dot 62a to be weakly tunnel coupled to the electron system of the electronic mesa structures 76a and 77a. The bias voltage to the gate electrode 68a (projection 84a) is selected at a value in the neighborhood of the threshold voltage at which tunnel coupling between the first and second quantum dots 61a and 62a disappears.

Next, the arrangement shown in FIG. 8A' differs from that in FIG. 8A in that a second quantum dot 62a' is formed as isolated from a first quantum dot 61a' by mesa etching and a gate electrode 68a' is used having no projection. The sizes Ma', $L_1a'$ and $L_2a'$ for the corresponding sites and the bias voltages used are the same as in the arrangement of FIG. 8A. The components corresponding to those in FIG. 8A are indicated by adding the mark "'" to the reference characters for those components. In this form of embodiment, the first and second quantum dots 61a' and 62a' are spaced apart across a gap of a size of about 0.1 μm.

Next, an MW/FIR light detector shown in FIG. 8B has an electronic mesa structure 63b a constricted end of which is located in the nodal region 70b, and in this region is there formed the first quantum dot 61b. The first quantum dot 61b, the electronic mesa structure 63b outside of it and the gate electrodes 67b and 68b are identical in shape and size to those shown in FIG. 8A'.

The SET offered by the second quantum dot 62b is prepared on the first quantum dot 61b by using the Dolan bridge method. For literature describing the Dolan bridge method, reference is made to T. A. Fulton and G. J. Dolan, Phys. Rev. Lett. 59, p. 109, 1987. To state specifically, using aluminum vapor deposition a second quantum dot 62b of 0.06 μm thick, 0.1 μm wide and 0.3 μm long is first prepared, a surface of which is oxidized in an oxygen gas atmosphere under a pressure of 10 mTorr and coated with a film of aluminum oxide. In this surface oxidation process, the time period for oxidation is adjusted so that the electrical resistance at the room temperature between the metal lead wires 76b and 77b to be described below falls in the range between 100 and 400 kΩ.

Subsequently, using skew or oblique vapor deposition, the metal lead wires 76b and 77b are prepared from aluminum vapor as applied onto a first quantum dot 61b. Each of these metal lead wires 76b and 77b is 0.06 μm thick and has a width of 0.1 μm at its forward end. In the present form of embodiment, however, the spacing 85b between the forward ends of the metal lead wires is set at 0.1 μm. Then, the forward ends of the metal lead wires 76b and 77b are formed to overlap with the second quantum dot 62b by a distance of 0.5 μm. Then, the metal lead wires 76b and 77b have been connected to a source and a drain electrode 81b and 82b, respectively. Thus, a SET is made up in which aluminum oxide interposed between each of the metal lead wires 76a and 77b and the second quantum dot 62b provides a tunnel junction.

An explanation is now given in respect of an operation of an MW/FIR light detector according to the said alternative form of embodiment of the present invention. Mention is made of an operation of the MW/FIR light detector shown in FIG. 8A. Referring to FIGS. 7A and 8A, first of all, bias voltages are applied to the gate electrode 76a, namely the projection 83a and to the gate electrode 68a, namely the projection 84a to form the first quantum dot 61a.

Next, in that state, biasing the gate electrodes 78a, 79a and 80a, thus applying a bias voltage to each of the metal lead wires 73a, 74a and 75a forms the second quantum dot 62a and renders the same operable as the SET. That is, a source-drain voltage $V_{SD}$ of 100 μV or less is applied across the electronic mesa structures 76a and 77a, and measurement is made of current drawn between them. Fine measurement is made of the bias voltage applied to the control gate electrode 79a, namely to the metal lead wire 74a so that when electromagnetic wave is incident to the dipole antenna 65a, the SET has a maximum conductivity. Further, the electronic mesa structures 63a and 76a are made equal to each other in electric potential.

Absorbing by the first quantum dot 61a an electromagnetic wave caught by the dipole antenna 65a ionizes the first quantum dot 61a to +e, which changes the electrostatic potential of the second quantum dot 62a and decreases the conductivity of the SET to a large extent. Detecting such change in conductivity by a current amplifier allows a single electromagnetic photon to be detected. To mention further, an electron that upon ionization gets out of the first quantum dot 61a into an external electronic mesa structure 63a is absorbed there.

Next, mention is made of an operation of the MW/FIR light detector of the structure shown in FIG. 8A'. Referring to FIGS. 7A and 8A' first of all, the first quantum dot 61a' is set up by applying a bias voltage to the gate electrode 67a', namely to the projection 83a'. And, the gate electrode 68a' is made equal in electric potential to the electronic mesa structure 63a.

Then in that state, the second quantum dot 62a' is set up to operate as the SET by biasing the gate electrodes 78a', 79a' and 80a', namely by applying bias voltage to the metal lead wires 73a', 74a' and 75a'. The operation otherwise follows the description made of that of the structure shown in FIG. 8A.

Finally, mention is made of the MWS/FIR light detector of the arrangement shown in FIG. 8B. The first quantum dot 61a is formed in the same manner as the first quantum dot 61a' shown in and described in connection with FIG. 8A'. The second quantum dot 62b has already been formed and set up to operate as the SET on the first quantum dot 61b. Referring to FIGS. 7B and 8B, a source-drain voltage $V_{SD}$ of 100 μV or less is applied across the source electrode 81b, namely the metal lead wire 76b and the drain electrode 82b, namely the metal lead wire 77b, and measurement is made of current drawn between them. In addition, the electronic mesa structure 63b and the gate electrode 68b are made equal in electric potential to each other, and fine adjustment is made of that electric potential in the range of +1 mV with respect to that, of the aluminum metal lead wire 76b so that the SET has a maximum conductivity when no electromagnetic wave is incident.

Ionization to +e of the first quantum dot 61b upon absorbing an electromagnetic wave changes the electrostatic potential of the second quantum dot 62b, which decreases the conductivity of the SET to a large extent as mentioned previously. Detecting such change in conductivity by a current amplifier allows a single electromagnetic photon absorption to be detected. To mention further, an electron that upon ionization gets out of the first quantum dot 61b into an external electronic mesa structure 63b is absorbed there.

In each of the three types of construction described, causing a positive hole and an electron that are excited upon absorbing an electromagnetic energy to be created separately in the inside and outside of the first quantum dot enables an extremely prolonged state of excitation, hence life of ionization to be established without the need to apply a magnetic field. The life of the ionized state of the first quantum dot 61a, 61a', 61b is 10 μsec or longer, which enables an electromagnetic photon to be detected with extreme ease. Therefore an MW/FIR light detector according to the aforementioned alternative form of embodiment provides a further rise in sensitivity and brings to realization a detector that is operable at a high temperature without the need to apply a magnetic filed.

Further, while in case excitation across discrete energy levels is utilized, wavelength selectivity develops in detecting an electromagnetic wave, on the other hand, the aforementioned alternative form of embodiment that utilizes excitation from a discrete to a continuous energy level permits detection with a detectable sensitivity in a continuous wavelength range that has an amount of energy in excess of ionization energy.

Also, as regards the range of operating temperatures, the charging energy of the second quantum dot 62a, 62a', 62b that forms the SET determines its upper limit, say up to about 1 K in the arrangement shown in FIG. 8B, up to about 1.3 K in that shown in FIG. 8A' and up to about 2 K in that shown in FIG. 8A. It follows therefore that the operating temperature can be raised up to a maximum of 2 K by making the second quantum dot so small.

Further, the fact that the ionization energy can be directly controlled through adjustment of the height, of the potential barrier and in turn by the gate voltage to the first quantum dot enables the threshold wavelength for detection determined by the ionization energy to be controlled. It follows therefore that in all of the type of construction mentioned it is possible to set, and determine the longest wavelength limit of detectable electromagnetic waves by the magnitudes of the bias voltage to the gate electrode 67a, 67a', 67b that forms the first quantum dot.

While the present invention has hereinbefore been describe in terms of various forms of embodiments thereof illustrated, it is to be understood that such disclosure is purely illustrative and is not to be interpreted as limiting. Consequently, without departing from the spirit and scope of the invention, various alterations, modifications, and/or alternative applications of the invention are possible and are not intended to be excluded from the scope of the present invention.

Referring next to FIGS. 9, 10, 11 and 12, an explanation is given in respect of results of the measurement in which single photons are actually detlected using an MW/FIR light detector according to the present invention under the use conditions for the aforementioned second case.

FIGS. 9 to 12 show examples of measurement by an MW/FIR single photon detector fabricated into the geometry shown in and described in connection with FIG. 3B, using a GaAs/Al$_{0.3}$Ga$_{0.7}$As hetero structure having an electron concentration of 2.3×10$^{15}$/m$^2$ and a two-dimensional electron mobility of 80 m$^2$/Vs.

FIGS. 9 and 10 show examples of measurement in which under the conditions of a measurement temperature of 0.07 K, V$_{SD}$=25 μV, V$_{CG}$=0 V and B=3.67 T, the conductivity of a SET was measured when an extremely weak FIR light emission from a quantum Hall-effect device, of a FIR light having a wavelength of 0.19 mm was incident, to the detector where the light emitting element had current I$_{emit}$=4 μA and the light emission had power at the BOTAI antenna of about 10$^{-18}$ W. The time constant, of measurement was 3 milliseconds.

Figure 9A:
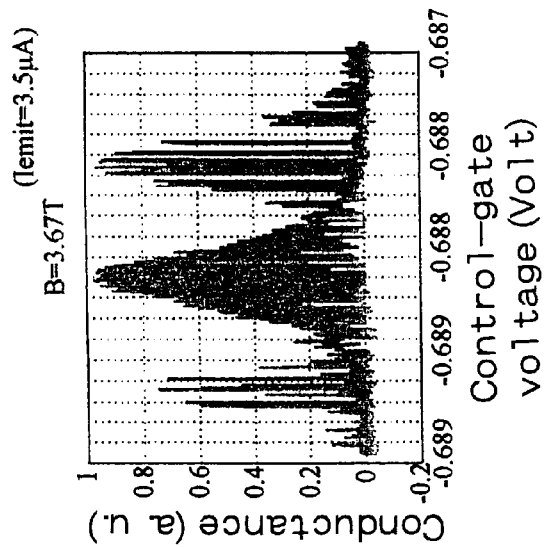
Figure 9B:
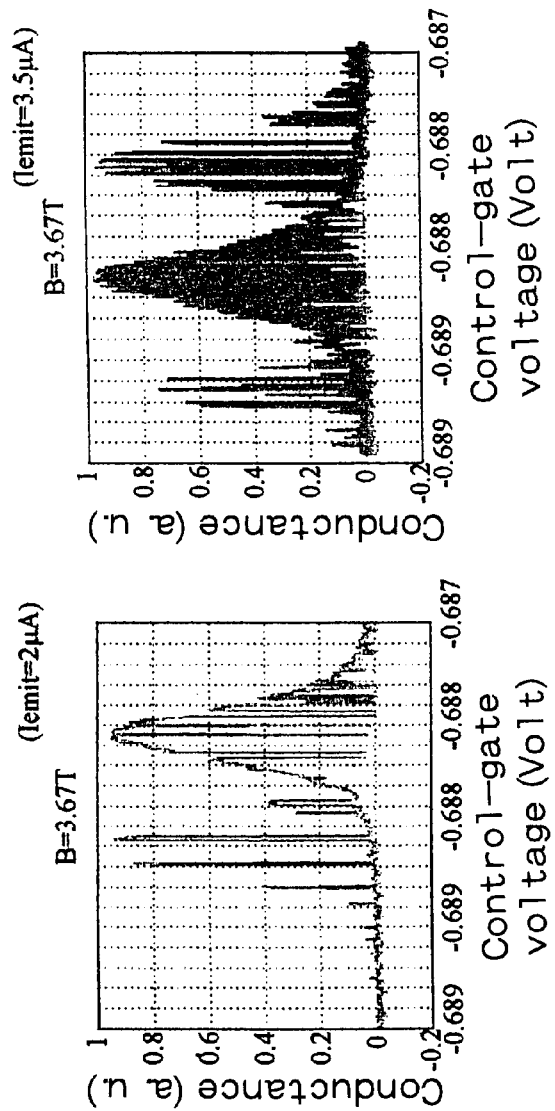
Figure 9C:
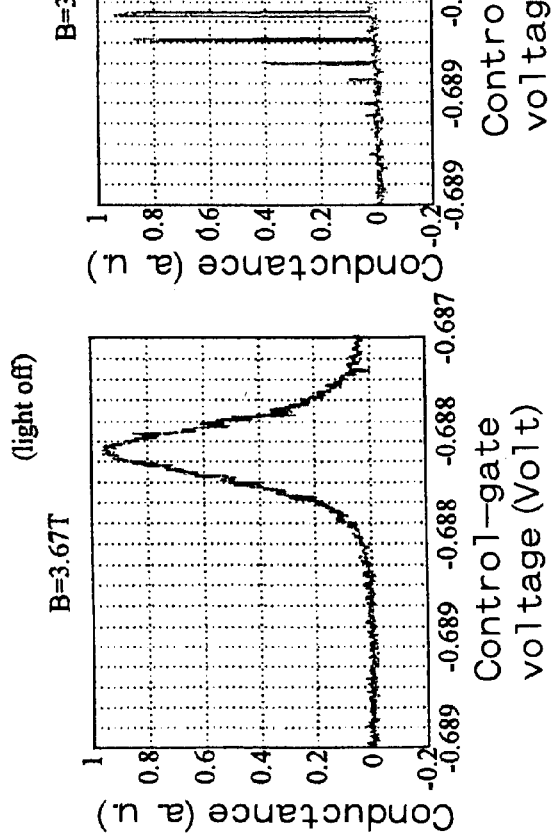

FIGS. 9A, 9B and 9C show dependency of the conductivity of a SET from the control gate electrode voltage V$_{CG}$. It is shown that a sharp peak of Coulomb oscillations that appears in a region of V$_{CG}$=−0.6881 V when the SET has no FIR light irradiation (FIG. 9A) is disturbed when the SET is irradiated with such extremely weak light (FIG. 9B), and with an increase in intensity of the light, the peak shifts to in a region of V$_{CG}$=0.886 V that corresponds to an excited state.

Figure 10D:
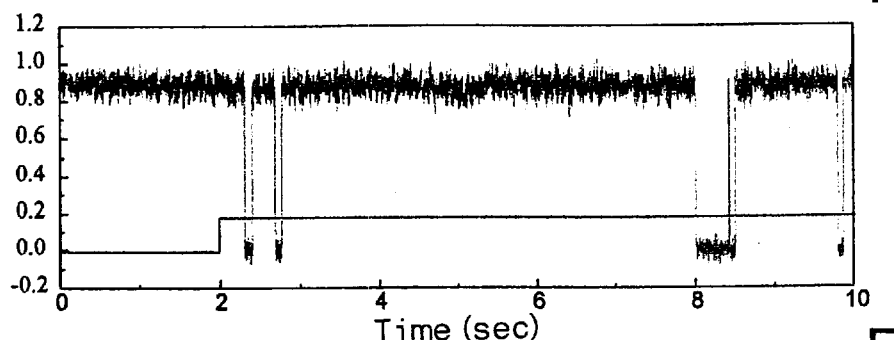
Figure 10E:
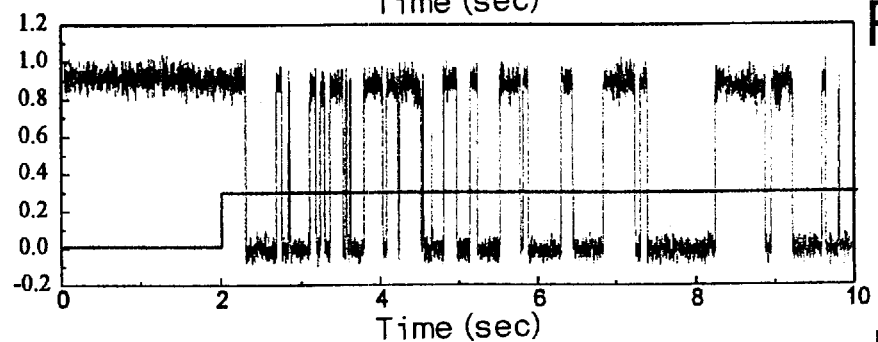
Figure 10F:
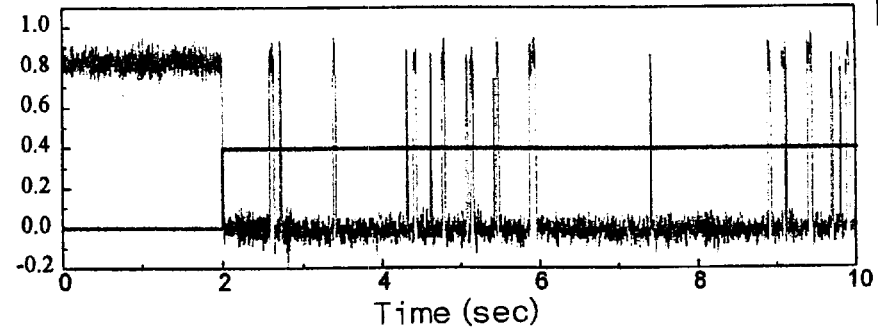
Figure 10G:
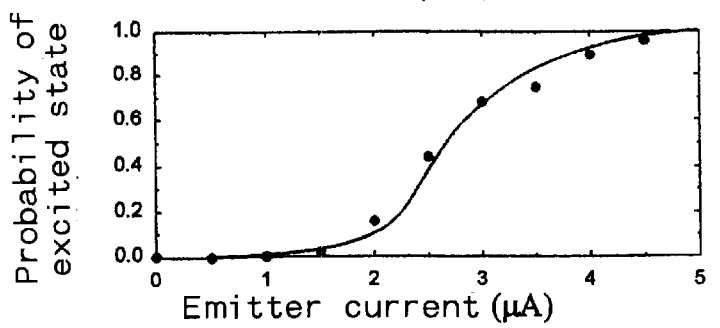

FIGS. 10D to 10F show change of the conductivity with time when the control gate voltage V$_{CG}$ is set at the peak position where there is no irradiation that is V$_{CG}$=0.6881 V. It is shown that each time a single photon is absorbed, the SET is switched on and off, and increasing the intensity of the FIR light causes the switching frequency (frequency of photons incoming) to increase.

Figure 11:
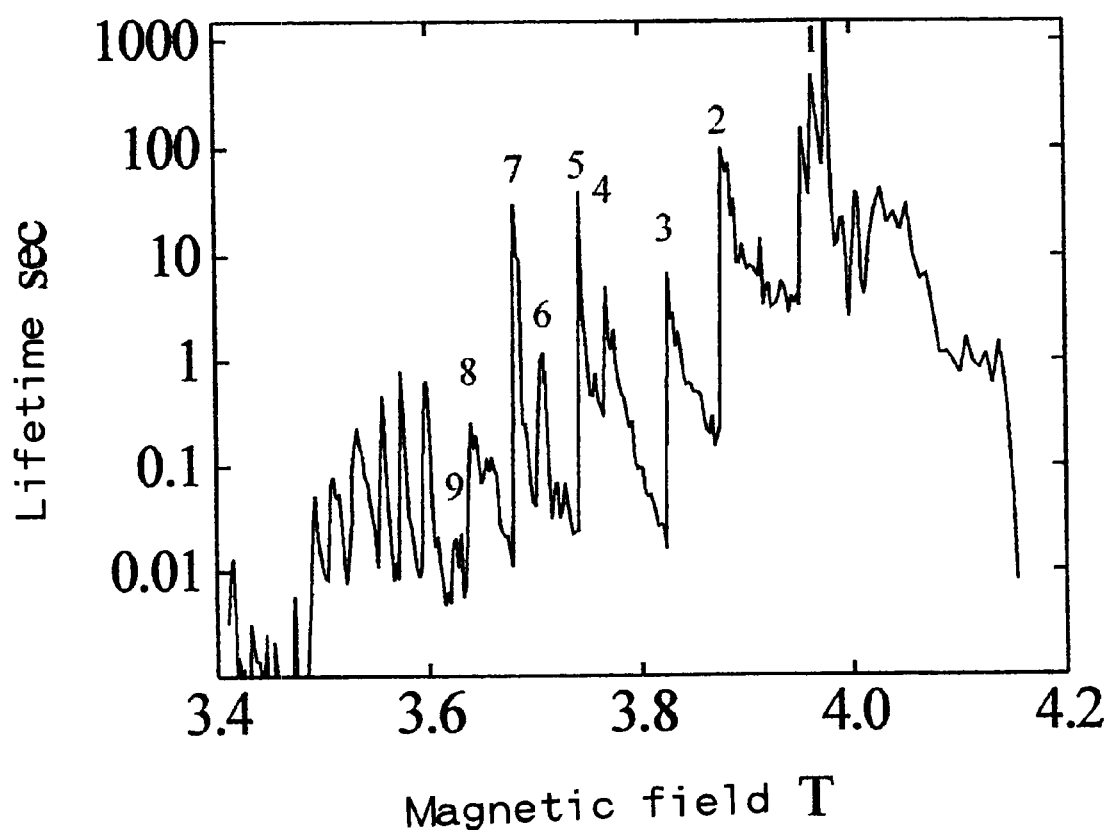
FIG. 11 is a graph illustrating an example of measurement for a single MW/FIR detection and showing dependency of the life of an excited state from the intensity of a magnetic field applied.

FIG. 11 shows strong dependency of the life of an excited state from a magnetic field applied. It is shown that when the magnetic field B=3.8 T, the life takes a maximum value in a region of ν=2, the value reaching the order of 1000 seconds. The fine structure of magnetic field dependency is found to be due to the fact the number of electrons present in an upper Landau level changes one by one as the magnetic field is varied.

Figure 12:
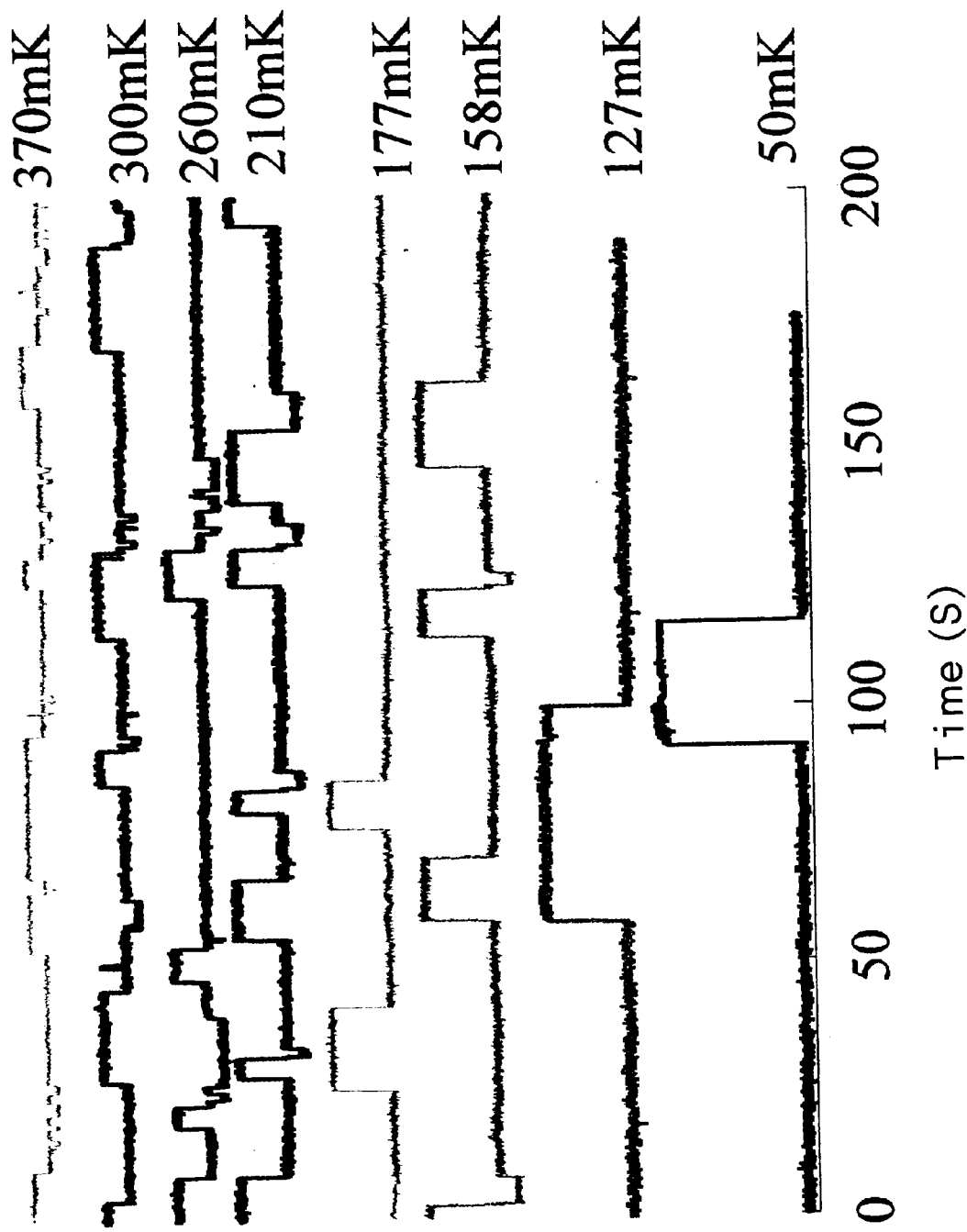
FIG. 12 illustrates an example of measurement for a single MW/FIR detection and shows temperature dependency of the switching operation of a SET that is operated by absorbing a single photon.

FIG. 12 indicates that if the temperature is raised to 0.37 K under the same conditions as in FIGS. 9 and 10, a single photon can be detected as well.

An MR/FIR light detector according to this form of embodiment is designed to measure the resonance excitation across electron levels in the semiconductor quantum dot through the amplifying effect of the single electron transistor. Therefore, an extremely weak photon packet can be detected at a rate of one for 100 seconds. Considering a measurement time period of 100 seconds, this degree of sensitivity corresponds to NEP=10$^{-23}$W/Hz$^{1/2}$, that is as much as ten million times better than the maximum degree of sensitivity attainable by the conventional detectors. It is also possible to make high-speed measurement in a time constant as short as 3 nanoseconds, without loosing the sensitivity.

Industrial Applicability

As has been set forth in detail in the foregoing description, an MR/FIR light detector according to the present invention offers the excellent effects and advantages that it provides a degree of sensitivity extraordinarily higher than those attainable with the conventional MR/FIR light detectors and is operable at a high speed, and therefore is highly useful.

What is claimed is:

1. An MW(millimeter wave)/FIR (far infra red) light detector comprising:
   an electromagnetic-wave coupler concentrating an electromagnetic wave in a small special region of a submicron size;
   a quantum dot for absorbing the concentrated electromagnetic wave to bring about an excited state including an electrostatic potential in the quantum dot, wherein an electron and a positive hole are spatially isolated from each other to create a polarization in the quantum dot;
   means for creating said excited state by anyone of
      (a) applying an electric field to said quantum dot according to a size effect of said quantum dot, for adjusting an energy difference between electron levels in the quantum dot to the energy of said electromagnetic wave, consequently creating the polarization after said absorption of the concentrated electromagnetic wave,
      (b) applying a magnetic field to said quantum dot according to a Landau level creation of said quantum dot, for adjusting an energy difference between Landau levels in the quantum dot to the energy of said electromagnetic wave, consequently creating the polarization after said absorption of the concentrated electromagnetic wave,
   wherein the created polarization is an annular polarization, or
      (c) applying a magnetic field to said quantum dot according to a magnetic energy separation of spin states of said quantum dot, for adjusting an energy difference between the spin states in the quantum dot to the energy of said electromagnetic wave, consequently creating the polarization after said absorption of the concentrated electromagnetic wave,
   wherein the created polarization is an annular polarization; and
   a single-electron transistor, including said quantum dot and comprising an adjustment to hold a gate-voltage constant at a value at which conductance of the transistor is a maximum when the excited state is absent;
   wherein the conductance of the transistor is diminished by the excited state of the quantum dot that is caused by the electromagnetic wave, such that the electromagnetic wave is detected through a change in the conductance; and
   wherein said polarization has a lifetime that is longer than a lifetime of a non-polarized excited state in which the quantum dot conducts by tunneling.

2. An MW/FIR light detector as set forth in claim 1, characterized in that the detector retains a state in which an electrical conductance of said single-electron semiconductor is varied according to said excited state of the quantum dot.

3. An MW/FIR light detector as set forth in claim 1 or claim 2, characterized in that said quantum dot has a life in a range of 10 nanoseconds to 1000 seconds in which it remains in said excited state before returning to a ground state thereof.

4. An MW/FIR light detector as set forth in claim 1 or claim 2, characterized in that said electron levels have a difference in energy that is controllable variably according to any one or a combination of a change in size of said quantum dot, an external magnetic field and a biasing voltage.

5. An MW/FIR light detector as set forth in claim 1, characterized in that said electromagnetic-wave coupling means comprises a standard or regular bow-tie antenna for electrically coupling said quantum dot and said electromagnetic wave together.

6. An MW/FIR light detector as set forth in claim 1, characterized in that said electromagnetic-wave coupling means comprises an anomalous or irregular bow-tie antenna having a node thereof short-circuited for magnetically coupling said quantum dot and said electromagnetic-wave together.

7. An MW/FIR light detector as set forth in claim 1 or claim 2, characterized in that the presence or absence of short-circuit, through a node of said electromagnetic-wave coupling means and the size of said quantum dot are determined according to the wavelength of said electromagnetic wave.

8. An MW/FIR light detector as set forth in any one of claim 1, claim 5 or claim 6, characterized in that said electromagnetic-wave coupling means provides a gate electrode for said single-electron transistor.

9. An MW(millimeter wave)/FIR (Infra red) light detector comprising: an electromagnetic-wave coupling means for concentrating an electromagnetic wave in a small special region of a sub-micron size; a first quantum dot for absorbing the electromagnetic wave concentrated by said electromagnetic-wave coupling means to bring about an ionization thereof; and a single-electron transistor including a second quantum dot electrostatically coupled to said first quantum dot, whereby said electromagnetic wave is detected on the basis of the fact that electric conductivity of said single-electron transistor varies with a change in electrostatic state of said second quantum dot consequent upon an ionization of said first quantum dot.

10. An MW/IR light detector as set forth in claim 9, characterized in that the ionization of said first quantum dot is brought about by excitation of an electron in a quantized bound state of said first quantum dot to a free electron state of an electron system outside of said first quantum dot.

11. An MW/IR light detector as set forth in claim 9 or claim 10, characterized in that the ionization energy of said first quantum dot is controllable variably by changing the magnitude of a bias voltage applied to a gate of said first quantum dot.

12. An MW/IR light detector as set forth in claim 9 or claim 10, characterized in that said first quantum dot has a life in a range between 1 microsecond and 1000 seconds in which it remains in the ionization state before returning to a neutral state.

13. An MW/IR light detector as set forth in claim 9 or claim 10, characterized in that said first and second quantum dots lies in an identical semiconductor structure and are isolated from each other electrostatically by bias voltages applied to respective gate thereof, respectively.

14. An MW/IR light detector as set forth in claim 9 or claim 10, characterized in that said first and second quantum dots are formed adjacent to each other across a gap in a semiconductor.

15. An MW/IR light detector as set forth in claim 9 or claim 10, characterized in that said second quantum dot comprises a metal dot formed on said first quantum dot and forms said single-electron transistor by having a tunnel junction with a metal lead wire formed on said metal dot.

16. An MW/IR light detector as set forth in claim 9 or claim 10, characterized in that said second quantum dot is an aluminum metal dot and has a portion of a said tunnel junction formed from aluminum oxide.

17. An MW/IR light detector as set forth in claim 9, characterized in that said electromagnetic-wave coupling means comprises a standard dipole antenna for electrically coupling said first quantum dot and said electromagnetic-wave together.

18. An MW/IR light detector as set forth in claim 9 or claim 17, characterized in that said electromagnetic-wave coupling means serves as a bias voltage applying gate that forms said first and second quantum dots.

19. An MW/IR light detector as set forth in any one of claim 1, claim 5, claim 6, claim 9 and claim 17, characterized in that said electromagnetic-wave coupling means has a lead portion oriented longitudinally in a direction that is perpendicular to a direction of the axis of polarization of said electromagnetic-wave coupling means.

20. An MW/IR light detector as set forth in any one of claim 1, claim 5, claim 9, and claim 17, characterized in that a node of said electromagnetic-wave coupling means is substantially equal in size to a maximum size of a said quantum dot.

21. An MW/IR light detector as set forth in any one of claim 1, claim 5, claim 9, and claim 17, characterized in that said electromagnetic-wave coupling means has an electrode diameter that is about one half less in length than the wavelength of said electromagnetic wave.

22. An MW/IR light detector as set forth in any one of claim 1, claim 2 and claim 9, transistor has a single hetero structure forming a two-dimensional electron system and a said quantum dot is formed by electrically confining a two-dimensional electron gas by a gate electrode of said single-electron transistor.

23. An MW/IR light detector as set forth in any one of claim 1, claim 2 and claim 9, characterized in that said single-electron transistor comprises a single hetero structure forming a two-dimensional electron system, a gate electrode for controlling electrostatic potential of a said quantum dot tunnel coupled to said two-dimensional electron system, and a source and a drain electrode that form a source and a drain region, respectively, which are tunnel coupled to said quantum dot.

24. An MW/IR light detector as set forth in any one of claim 1, claim 2 and claim 9, characterized in that said single-electron transistor includes a gate electrode for controlling source-drain electric current and a gate electrode for forming a said quantum dot.

25. An MW/IR light detector as set forth in anyone of claim 1, claim 5, claim 6, and claim 9 and claim 17, characterized in that a source electrode and a drain electrode of said single-electron transistor are spaced apart from each other by a distance that is not less than the length of said electromagnetic-wave coupling means in a direction of its axis of polarization.

26. An MW/IR light detector as set forth in anyone of claim 1, claim 9, and claim 17, characterized in that said single-electron transistor comprises a compound semiconductor.

27. An MW/IR light detector as set forth in any one of claim 1, claim 9, and claim 17, characterized in that said single-electron transistor is a III–V group compound semiconductor.

28. An MW/IR light detector as set forth in any one of claim 1, claim 9, and claim 17, characterized in that said single-electron transistor has a III–V group compound semiconductor superlattice selection doped, single hetero structure.

29. An MW/IR light detector as set forth in any one of claim 1, claim 9, and claim 17, characterized in that said single-electron transistor has a aluminum-gallium/gallium-arsenide selection doped, single hetero structure.

30. An MW/IR light detector as set forth in any one of claim 9 to claim 10 and claim 17, characterized in that said single-electron transistor is a IV group semiconductor.

31. An MW/IR light detector as set forth in any one of claim 1, claim 9, and claim 17, characterized in that said single-electron transistor is formed symmetrically about a said quantum dot.

32. An MW/IR light detector as set forth in any one of claim 1, claim 2, claim 5, claim 6, claim 9, claim 10 and claim 17 characterized in that the detector further includes a light introducing means for guiding said electromagnetic wave into said electromagnetic-wave coupling means.

* * * * *

UNITED STATES PATENT AND TRADEMARK OFFICE
CERTIFICATE OF CORRECTION

PATENT NO.   : 6,627,914 B1
DATED        : September 30, 2003
INVENTOR(S)  : Komiyama et al.

It is certified that error appears in the above-identified patent and that said Letters Patent is hereby corrected as shown below:

Column 2,
Lines 11 and 15, replace "single-electron semiconductor" with -- single-electron transistor --

Column 22,
Line 53, replace "single-electron semiconductor" with -- single-electron transistor --

Signed and Sealed this

Twenty-seventh Day of July, 2004

JON W. DUDAS
*Acting Director of the United States Patent and Trademark Office*